United States Patent
Kim et al.

(10) Patent No.: US 8,308,896 B2
(45) Date of Patent: Nov. 13, 2012

(54) METHODS TO REMOVE FILMS ON BEVEL EDGE AND BACKSIDE OF WAFER AND APPARATUS THEREOF

(75) Inventors: Yunsang Kim, Fremont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/053,037

(22) Filed: Mar. 21, 2011

(65) Prior Publication Data

US 2011/0209725 A1 Sep. 1, 2011

Related U.S. Application Data

(63) Continuation of application No. 11/440,561, filed on May 24, 2006, now Pat. No. 7,909,960, which is a continuation-in-part of application No. 11/237,327, filed on Sep. 27, 2005, now abandoned.

(51) Int. Cl.
| | |
|---|---|
| C23F 1/00 | (2006.01) |
| H01L 21/306 | (2006.01) |
| B44C 1/22 | (2006.01) |
| C03C 25/68 | (2006.01) |
| C03C 15/00 | (2006.01) |

(52) U.S. Cl. .................. 156/345.3; 156/345.43; 216/67
(58) Field of Classification Search .................. 216/67; 156/345.43, 345.35
See application file for complete search history.

(56) References Cited

U.S. PATENT DOCUMENTS

| | | |
|---|---|---|
| 5,273,588 A | 12/1993 | Foster et al. |
| 5,693,241 A | 12/1997 | Banks et al. |
| 5,788,799 A | 8/1998 | Steger et al. |
| 5,961,772 A | 10/1999 | Selwyn |
| 6,013,155 A | 1/2000 | McMillin et al. |
| 6,153,044 A | 11/2000 | Klebanoff et al. |
| 6,189,570 B1 | 2/2001 | Redemann et al. |
| 6,364,957 B1 | 4/2002 | Schneider et al. |
| 6,471,830 B1 | 10/2002 | Moslehi et al. |

(Continued)

FOREIGN PATENT DOCUMENTS

JP        05-082478        4/1993

(Continued)

OTHER PUBLICATIONS

"Final Office Action", U.S. Appl. No. 11/440,561, Mailing Date: May 20, 2010.

(Continued)

*Primary Examiner* — Keath Chen
(74) *Attorney, Agent, or Firm* — Beyer Law Group LLP

(57) ABSTRACT

A method of cleaning a bevel edge of a substrate in an etch processing chamber is provided. The method includes placing a substrate on a substrate support in a processing chamber. The method also includes flowing a cleaning gas through a gas feed located near a center of a gas distribution plate, disposed at a distance from the substrate support. The method further includes generating a cleaning plasma near a bevel edge of the substrate to clean the bevel edge by powering a bottom edge electrode or a top edge electrode with a RF power source and grounding the edge electrode that is not powered by the RF power source, the bottom edge electrode surrounds the substrate support and the top edge electrode surrounds the gas distribution plate.

15 Claims, 18 Drawing Sheets

U.S. PATENT DOCUMENTS

| | | | |
|---|---|---|---|
| 6,534,921 | B1 | 3/2003 | Seo et al. |
| 6,837,967 | B1 | 1/2005 | Berman et al. |
| 2002/0142612 | A1 | 10/2002 | Wu et al. |
| 2003/0006008 | A1 | 1/2003 | Horioka et al. |
| 2003/0164142 | A1 | 9/2003 | Koshimizu |
| 2004/0108068 | A1 | 6/2004 | Senzaki et al. |
| 2004/0137745 | A1* | 7/2004 | Houghton et al. ............ 438/706 |
| 2004/0238488 | A1 | 12/2004 | Choi et al. |
| 2005/0173067 | A1 | 8/2005 | Lim |
| 2005/0178505 | A1 | 8/2005 | Kim |
| 2005/0205519 | A1 | 9/2005 | Kim et al. |
| 2007/0068623 | A1 | 3/2007 | Kim et al. |
| 2007/0068900 | A1 | 3/2007 | Kim |
| 2007/0186855 | A1 | 8/2007 | Dhindsa |
| 2007/0199658 | A1 | 8/2007 | Dhindsa et al. |

FOREIGN PATENT DOCUMENTS

| | | |
|---|---|---|
| JP | 6-338475 | 12/1994 |
| JP | 7-142449 | 6/1995 |
| JP | 8-158072 | 6/1996 |
| JP | 8-279494 | 10/1996 |
| JP | 2005-005701 | 1/2005 |
| JP | 2005-519469 | 6/2005 |
| KR | 102002080955 | 10/2002 |

OTHER PUBLICATIONS

"Final Office Action", U.S. Appl. No. 11/237,327; Mailing Date: Feb. 11, 2009.

"Final Office Action", U.S. Appl. No. 11/237,327; Mailing Date: Apr. 11, 2008.

"Final Office Action", U.S. Appl. No. 11/237,327; Mailing Date: Apr. 14, 2010.

"Final Office Action", U.S. Appl. No. 11/237,327; Mailing Date: Sep. 21, 2009.

"Non Final Office Action", U.S. Appl. No. 11/237,327; Mailing Date: Dec. 14, 2010.

"Non Final Office Action", U.S. Appl. No. 11/237,327, Mailing Date: Feb. 9, 2010.

"Non-Final Office Action", U.S. Appl. No. 11/237,327; Mailing Date: Oct. 23, 2007.

"Non-Final Office Action", U.S. Appl. No. 11/237,327; Mailing Date: Oct. 9, 2008.

"International Preliminary Report on Patentability", PCT Application No. PCT/US2006/037492; Mailing Date: Oct. 16, 2008.

"International Search Report", PCT Application No. PCT/US06/37492; Mailing Date: Jul. 9, 2008.

"Written Opinion", PCT Application No. PCT/US06/37492; Mailing Date: Jul. 9, 2008.

"Australian Patent Office Written Opinion and Search Report", Application No. SG200802000-0; Mailing Date: Dec. 23, 2008.

"Australian Patent Office Examination Report", Singapore Application No. 200802000-0; Mailing Date: Apr. 15, 2010.

"Final Office Action", U.S. Appl. No. 11/440,561, Mailing Date: Dec. 28, 2009.

"Final Office Action" U.S. Appl. No. 11/440,561, Mailing Date: Mar. 4, 2009

"Non Final Office Action", U.S. Appl. No. 11/440,561, Mailing Date: Jul. 22, 2009.

"Non Final Office Action", U.S. Appl. No. 11/440,561, Mailing Date: Mar. 30, 2010.

"Non-Final Office Action", U.S. Appl. No. 11/440,561, Mailing Date: Oct. 15, 2008.

"First Office Action", CN Application No. 200680035882.9, Mailing Date: Jun. 19, 2009.

"International Preliminary Report on Patentability", PCT Application No. PCT/US2006/037648; Mailing Date, Mar. 11, 2008.

"Written Opinion", PCT Application No. PCT/US2006/037648; Mailing Date: Mar. 4, 2007.

Davis, Warren "How does a Faraday Cage work? Or, Why can a satellite dish have holes in it?"; URL: http://www.physlink.com/Education/AskExperts/ae176.cfm: Total pp. 2.

Aldea et al., "Generation of a Stable Atmospheric Glow in a DBD Configuration"; Eindhoven University of Technology; Dept. of Applied Physics, Eindhoven: The Netherlands; pp. 1-7.

Kunze, Kerstin "Miniaturized Discharges—Prospects and Limits for Quantitative analysis"; Dissertation; Zur Erlangung Doktorgrades der Naturwissenschaften des Fachbereichs der Universitat Dortmund; 2004; pp. 1-143.

Selwyn et al, "Materials Processing using an Atmospheric-Pressure Plasma Jet"; Physics Division Progress Report 1999-2000; pp. 189-197.

Kogelschatz, U. "Fundamentals and Applications of Dielectric-Barrier Discharges"; ABB Corporate Research Ltd.; Switzerland; May 24, 2000; pp. 1-7.

Babayan et al, "Deposition of silicon dioxide films with a non-equilibrium atmospheric-pressure plasma jet"; 2001; Institute of Physics Publishing Ltd; pp. 573-578.

Ichiki et al., "An atmospheric-pressure microplasma jet source for the optical emission spectroscopic analysis of liquid sample"; 2003; Institute of Physics Publishing; pp. S16-S20.

Tepper et al., "Pulsed uniform barrier discharges at atmospheric pressure", Hakone VI international Symposium on High Pressure, Low Temperature Plasma Chemistry; Cork, Ireland; Aug. 31-Sep. 2, 1998; pp. 1-5.

Fong, HP "Journal of Electronic Materials: Electroless Cu Deposition Process on TiN for ULSI interconnect fabrication via Pd/Sn colloid activation", URL: http://www.findarticles.com/p/articles/mi_qa3776/is_200301/ai_n9178017/print; Jan. 2003; pp. 1-4.

Sievenpiper et al., "3D Wire Mesh Photonic Crystals"; Apr. 1, 1996; The American Physical Society vol. 76, No. 14; pp. 2480-2483.

"First Office Action", Japanese Patent Application No. 2008/533521, Mailing Date: Aug. 3, 2011.

* cited by examiner

METHODS TO REMOVE FILMS ON BEVEL EDGE AND BACKSIDE OF WAFER AND APPARATUS THEREOF

PRIORITY CLAIM

This application is a continuation of and claims priority under 35 U.S.C.§120 to a commonly assigned application entitled "Apparatus And Methods To Remove Films On Bevel Edge And Backside Of Wafer," by Kim et al., application Ser. No. 11/440,561, filed on May 24, 2006, which was issued on Mar. 22, 2011, as U.S. Pat. No. 7,909,960 and which is a continuation-in-part application of U.S. patent application Ser. No. 11/237,327 filed on Sep. 27, 2005 now abandoned, and titled "Apparatus For The Removal Of A Set Of Byproducts From A Substrate Edge And Methods Therefor," all of which are incorporated by reference herein.

BACKGROUND

The present invention relates in general to substrate manufacturing technologies and in particular to apparatus and methods for the removal etch byproducts from a bevel edge and a backside of a substrate.

In the processing of a substrate, e.g., a semiconductor substrate (or wafer) or a glass panel such as one used in flat panel display manufacturing, plasma is often employed. During substrate processing, the substrate (or wafer) is divided into a plurality of dies, or rectangular areas. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 5 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during substrate transport. For example, substrates are commonly moved in sets between plasma processing systems via substantially clean containers, often called cassettes. As a higher positioned substrate is repositioned in the container, byproduct particles (or flakes) may fall on a lower substrate where dies are present, potentially affecting device yield.

Etch byproducts can also be deposited on the backside of substrate support due to contamination or handling during the etching process. Since the substrate backside is not exposed to etching plasma, the byproduct polymer layer formed on the backside is not removed during subsequent etch processing steps. Therefore, the byproduct polymer layer can also accumulate on the substrate backside in a manner similar to the accumulation of polymer layer near the top and bottom surfaces of a substrate edge, and can result in particle problems. In addition, the interior of the process chamber, such as chamber walls, can also accumulate etch byproduct polymers, which needs to be removed periodically to avoid byproducts accumulation and chamber particle issues.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, thereby impacting device yield.

In view of the foregoing, there is a need for apparatus and methods that provide improved mechanisms of removal of etch byproducts, dielectric films and metal films near the substrate bevel edge, and etch byproducts on substrate backside and chamber interior to avoid accumulation of polymer byproducts and deposited films and to improve process yield.

BRIEF DESCRIPTION OF THE DRAWINGS

The present invention will be readily understood by the following detailed description in conjunction with the accompanying drawings, and like reference numerals designate like structural elements.

FIG. 1AA is an enlarged schematic diagram of region B in FIG. 1A.

DETAILED DESCRIPTION OF THE EXEMPLARY EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Several exemplary embodiments for improved mechanisms to remove etch byproducts, dielectric films and metal films near the substrate bevel edge, and etch byproducts on substrate backside and chamber interior to avoid polymer byproduct and film accumulation and to improve process yield. It will be apparent to those skilled in the art that the present invention may be practiced without some or all of the specific details set forth herein.

Figure 1A:
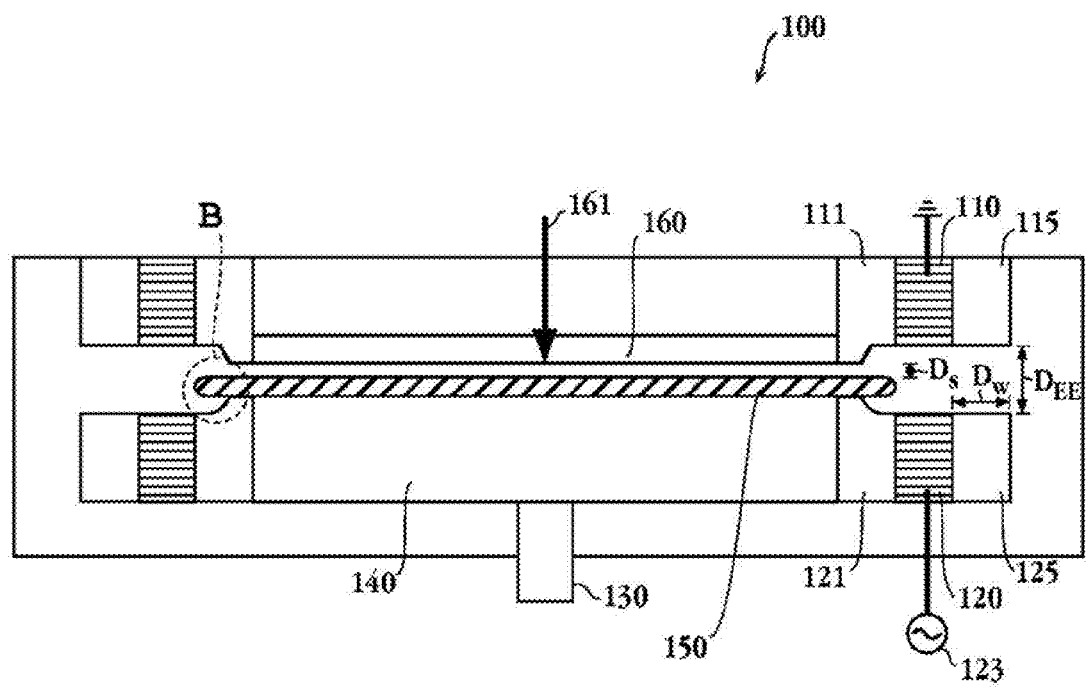
FIG. 1A shows a schematic diagram of one embodiment of a substrate etching system with a pair of top and bottom edge electrodes.
Figure 1A:
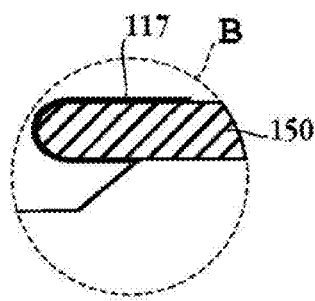

FIG. 1A shows an embodiment of an etch process chamber 100. Chamber 100 has a substrate support 140 with a substrate 150 on top. In one embodiment, the substrate support 140 is an electrostatic chuck, which is powered by a RF (radio frequency) power source (not shown). In another embodiment, the substrate support 140 is a regular electrode. The substrate support 140 can be DC (direct current) or RF biased. Opposing the substrate support 140 is a gas distribution plate 160 with a gas feed 161. The substrate support can also be RF powered, biased, or grounded. During etching of substrate 150, chamber 100 can be RF powered to generate capacitively coupled etch plasma or inductively coupled etch plasma. The substrate 150 has a bevel edge 117 that includes a top and a bottom surface of the edge of the substrate, as shown in region B of FIG. 1A and enlarged region B in FIG. 1AA. In FIG. 1AA, bevel edge 117 is highlighted as a bold solid line and curve.

Surrounding the edge of substrate support 140, there is a bottom edge electrode 120, made of conductive materials, such as aluminum (Al). Between the substrate support 140 and the bottom edge electrode 120, there is a bottom dielectric ring 121 electrically separating the substrate support 140 and the bottom edge electrode 120. In one embodiment, substrate 150 is not in contact with the bottom edge electrode 120. Beyond the bottom edge electrode 120, there is another bottom insulating ring 125, which extends the surface of the bottom edge electrode 120 facing substrate 150.

Surrounding the gas distribution plate 160, there is a top edge electrode 110, made of conductive materials, such as aluminum (Al). The top edge electrode 110 is electrically insulated from the gas distribution plate 160 by a top dielectric ring 111. Beyond the top edge electrode 110, there is top insulating ring 115, which extends the surface of the top edge electrode 110 facing substrate 150.

In one embodiment, the bottom edge electrode 120 is coupled to a RE power source 123 and the top edge electrode 110 is grounded. During a substrate bevel edge cleaning process, the RF power source 123 supplies RF power at a frequency between about 2 MHz to about 13 MHz and a power between about 100 watts to about 2000 watts to generate a cleaning plasma. During bevel edge cleaning the substrate support 140 and the gas distribution plate 160 are kept electrically floating. The cleaning plasma is configured to be confined by the top dielectric ring 111, top edge electrode 110, the top insulating ring 115, the bottom dielectric ring 121, the bottom edge electrode 120, and the bottom insulating ring. The cleaning gas(es) is supplied through the gas feed 161. In one embodiment, the gas feed is located near the center of the gas distribution plate 160. Alternatively, the cleaning gas(es) can also be supplied through gas feed(s) disposed in other parts of the process chamber 100.

To clean etch byproduct polymers, cleaning gases can include an oxygen-containing gas, such as $O_2$. Some amount, such as <10%, of a fluorine-containing gas, such as $CF_4$, $SF_6$, or $C_2F_6$, can also be added to clean the polymer in one embodiment. It should be appreciated that nitrogen-containing gas, such as $N_2$, can also be included in the gas mixture. The nitrogen-containing gas assists dissociation of the oxygen-containing gas. An inert gas, such as Ar or He, can also be added to dilute the gas and/or to maintain the plasma. To clean a dielectric film(s), such as SiN or $SiO_2$, at the bevel edge 117, a fluorine-containing gas, such as $CF_4$, $SF_6$, or a combination of both gases, can be used. An inert gas, such as Ar or He, can also be used to dilute the fluorine-containing gas and/or to maintain the cleaning plasma. To clean a metal film(s), such as Al or Cu, at the bevel edge 117, a chlorine-containing gas, such as $Cl_2$, or $BCl_3$, or a combination of both gases, can be used. An inert gas, such as Ar or He, can also be used to dilute the chlorine-containing gas and/or to maintain the plasma to clean the metal film(s).

In one embodiment, the space between the top edge electrode 110 and the bottom edge electrode 120, $D_{EE}$, is less than 1.5 cm to ensure the plasma is confined. A $D_{EE}$ of less than 1.5 cm allows the ratio between the width ($D_W$) and gap ($D_{EE}$) of the opening near substrate edge to be less than 4:1, which ensures plasma confinement. $D_W$ is the width of the opening near the substrate edge. In one embodiment, $D_W$ is the width of the bottom insulating ring 125 or the width of the top insulating ring 115. The chamber pressure is kept between about 100 mTorr to about 2 Torr during the bevel edge cleaning process. The spacing between the gas distribution plate

160 and substrate 150, $D_S$, is less than 0.6 mm to ensure no plasma is formed between the top electrode 160 and the substrate 150 during the bevel edge cleaning process.

In another embodiment, the RF power supply can be coupled to the top edge electrode 110, while the bottom edge electrode 120 is grounded to generate the capacitively coupled cleaning plasma. Alternatively, either the top edge electrode 110 or the bottom edge electrode 120 can be replaced with an inductive coil buried in a dielectric material. In this embodiment, the inductive coil is coupled to a RF power source and the opposing edge electrode is grounded. The RF power source supplies power to generate an inductively coupled etch plasma to clean the bevel edge 117.

The plasma generated near the substrate edge and between the top edge electrode 110 and the bottom edge electrode 120 cleans the substrate bevel edge of the substrate. The cleaning helps reduce the build-up of polymer at the substrate bevel edge, which reduces or eliminates the possibility of particle defects impacting device yield.

Figure 1B:
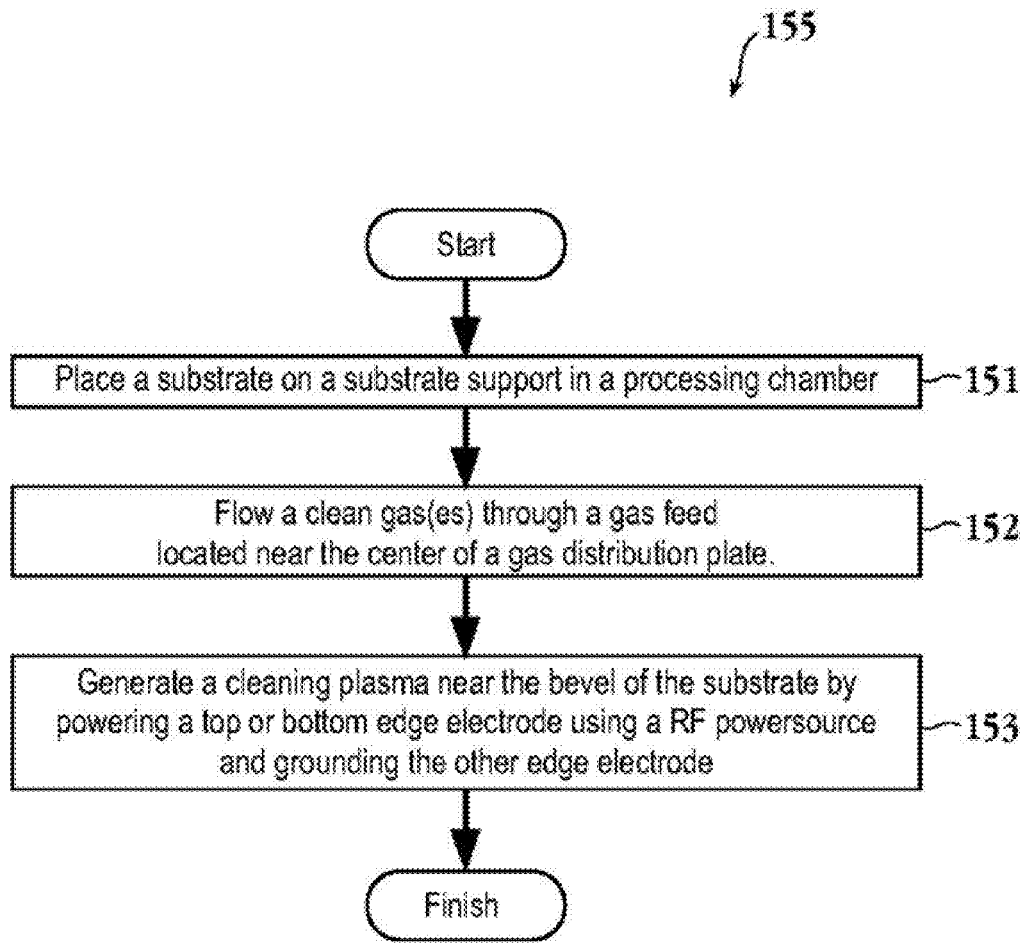
FIG. 1B shows a process flow of using the top and bottom edge electrodes of FIG. 1A to etch byproducts near substrate bevel edge.

FIG. 1B shows an embodiment of a process flow 150 for cleaning the bevel edge of the substrate. The process starts at step 151 by placing a substrate on a substrate support in a processing chamber. The process is followed by flowing a cleaning gas(es) through a gas feed located near the center of the gas distribution plate at step 152. At step 153, a cleaning plasma is then generated near the bevel edge of the substrate by powering either the top or the bottom edge electrode using a RF power source and by grounding the edge electrode that is not powered by the RF source.

Figure 1C:
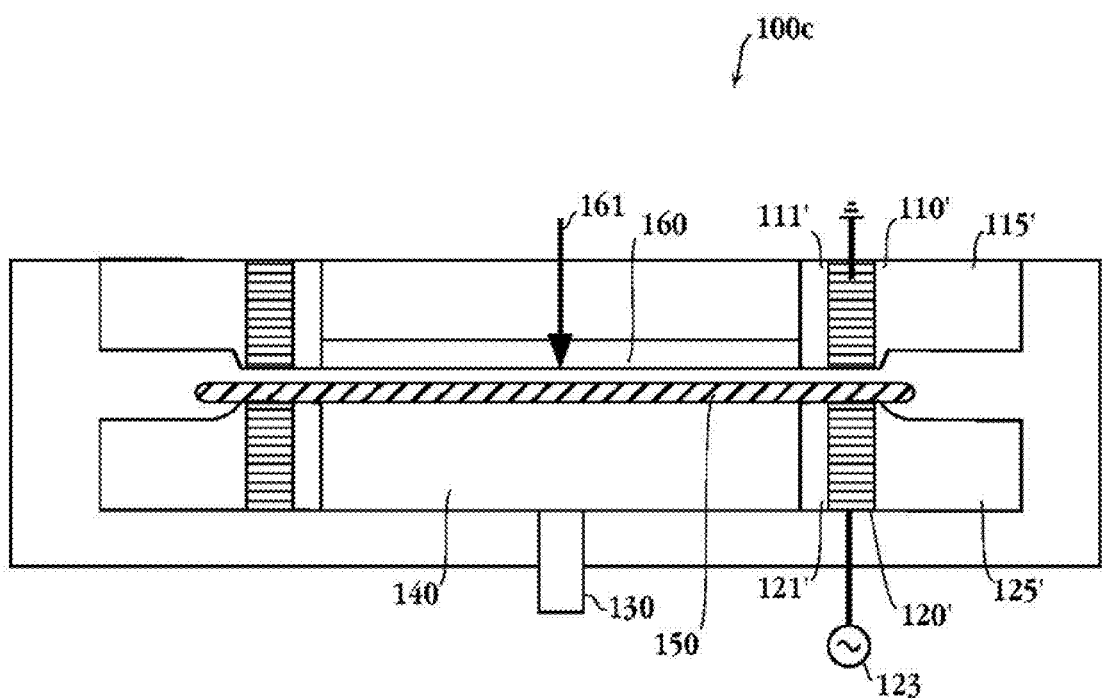
FIG. 1C shows a schematic diagram of another embodiment of a substrate etching system with a pair of top and bottom edge electrodes.

FIG. 1C shows another embodiment of the bevel edge cleaning mechanism. The components in the process chamber 100C of this embodiment is very similar to those shown in FIG. 1A. The different is that, in this embodiment, the bottom edge electrode 120' is moved inward to be in contact with a bottom surface of the substrate 150. The bottom edge electrode 120' is fully under the substrate 150 to ensure that the bottom edge electrode 120' does not get sputtered during cleaning process. The RF power supply 123 supplies a RF power that is transmitted through the substrate 150 to generate a cleaning plasma with the grounded top edge electrode 110. The cleaning plasma cleans the bevel edge. Due to direct RF through the substrate, the substrate has higher DC potential, compared to the embodiment shown in FIG. 1A. The higher DC potential on the substrate results in higher ion energy and a higher etch rate.

Figure 1D:
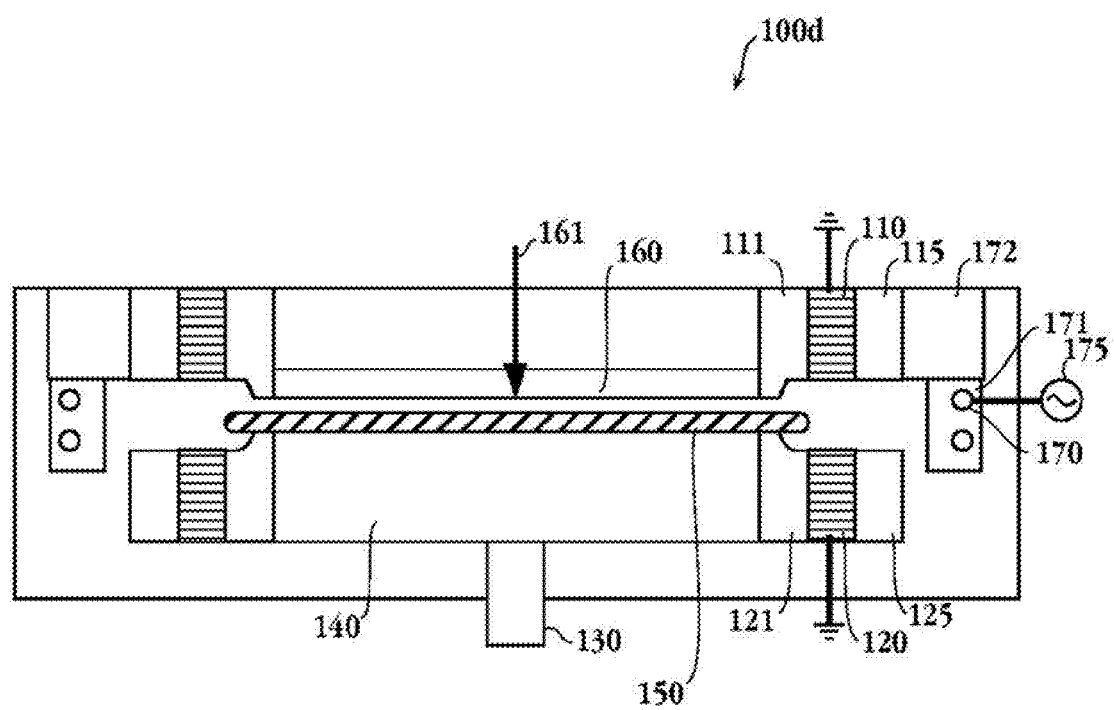
FIG. 1D shows a schematic diagram of an embodiment of a substrate etching system with a pair top and bottom edge electrodes, and surrounding inductive coils.

FIG. 1D shows another embodiment of the bevel edge cleaning apparatus. In this embodiment, the components in the process chamber 100D are similar to those in FIG. 1A. The difference is that an inductive coil(s) 170 surrounds the substrate bevel and the space between the top edge electrode 110 and the bottom edge electrode 120. The inductive coil 170 is embedded in a dielectric material 171 and is coupled to a RF power supply 175. In one embodiment, the dielectric material 171 is coupled to a dielectric support 172.

The inductive coil(s) 170 is coupled to a RF power, source 175. During the bevel cleaning process, the RF power source 175 supplies RF power in a range between about 2 MHz to about 13 MHz to generate an inductive plasma near the substrate bevel; in one embodiment. The top edge electrode 110 and the bottom edge electrode 120 are both grounded to provide a returning path for the inductive plasma. The plasma generated can efficiently clean the bevel edge and the substrate backside. Inductive coil 170 can provide a high density plasma to efficiently clean the bevel edge.

The inductive coil 170 shown in FIG. 1D can also be used generate plasma to clean the substrate backside and chamber wall. During substrate backside cleaning, the substrate 150 is raised up to be away from the substrate support 140 by lift pins (not shown). In one embodiment, the pressure in the process chamber is kept below 500 mTorr. The lower chamber pressure allows the cleaning plasma to diffuse under the backside of the substrate. For substrate backside cleaning, the distance requirement between the gas distribution plate 160 and substrate 150, $D_S$, still needs to be kept below 0.6 mm to ensure plasma does not form between the gas distribution plate 160 and the substrate 150. However, the space between the top edge electrode 110 and the bottom edge electrode 120, $D_{EE}$, is no longer needed. Cleaning plasma does not need to be confined between the top edge electrode 110 and bottom edge electrode 120 or between the top insulating ring 115 and bottom insulating ring 125. The cleaning plasma needs to diffuse under raised substrate 150 to clean the substrate backside. It should be appreciated that configurations and processes similar to the ones used to clean the substrate backside can also be used to clean the etch byproducts accumulated in the chamber interior, including the chamber walls. During chamber interior cleaning, the substrate can stay in the chamber or can be removed from the chamber. In one embodiment, substrate backside cleaning and chamber interior cleaning can occur simultaneously.

Figure 1E:
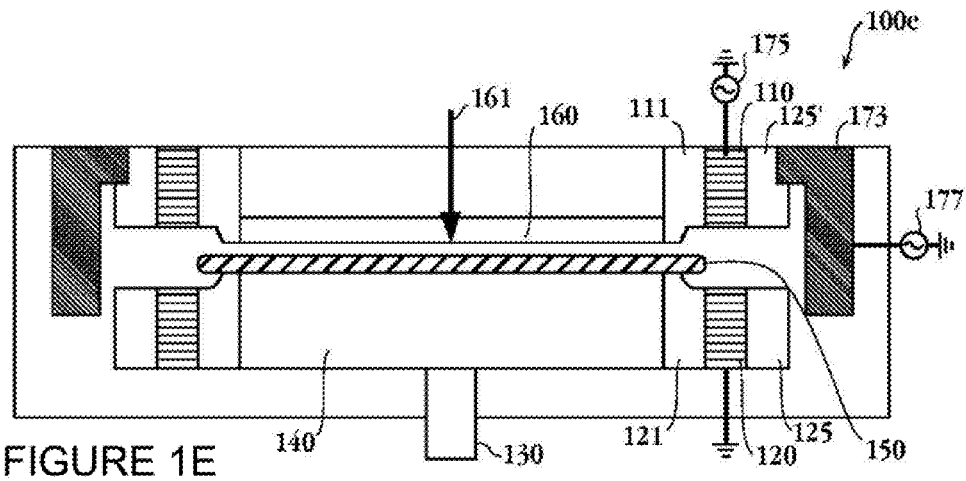
FIG. 1E shows a schematic diagram of an embodiment of a substrate etching system with a pair of top and bottom edge electrodes, and an overhang electrode surrounding the pair of edge electrodes.

As described above, capacitively coupled plasma can also be used to clean bevel edge and to clean substrate backside. To clean the bevel edge, the frequency of RF power used is be between about 2 MHz to about 13 MHz. To clean the chamber edge, the frequency of RF power is between about 27 MHz to about 60 MHz. FIG. 1E shows another embodiment that allows cleaning the bevel edge, substrate backside and chamber interior using dual RF frequencies. In this embodiment, a conductive overhang 171 is placed surrounding the opening between the top edge electrode 110 and the bottom edge electrode 120. In one embodiment, the conductive overhang 171 is coupled to a high-frequency RF power source 177, the top edge electrode 110 is coupled to a low-frequency RF power source 175, and the bottom edge electrode 120 is grounded. The high-frequency RF power has a frequency between about 27 MHz to about 60 MHz. The low-frequency RF power has a frequency between about 2 MHz to about 13 MHz. During substrate backside and chamber interior cleaning, the high-frequency RF power source 177 supplies the RF power to generate cleaning plasma. The top electrode 110 is grounded. In one embodiment, the chamber pressure is kept below 500 mTorr. The substrate is raised above the substrate support by the lift pins (not shown). The spacing requirement between the top edge electrode and the bottom edge electrode of <1.5 cm is no longer needed. Cleaning plasma needs to diffuse under substrate backside and diffuse to other parts of the chamber interior for cleaning. However, the spacing requirement between the gas distribution plate 160 and the substrate 150 of <0.6 mm is still needed to ensure plasma does not form between the gas distribution plate 160 and the substrate 150. The relatively low chamber pressure of less than 500 mTorr allows the process plasma to discuss beneath the substrate and the chamber cleaning plasma can clean the entire chamber.

During the bevel edge cleaning, the low-frequency RF power source 175 supplies the RF power to generate cleaning plasma. The conductive overhang is grounded. In one embodiment, the chamber pressure is kept between about 100 mTorr to about 2 Torr. The spacing requirement between the top edge electrode and the bottom edge electrode of <1.5 cm and the spacing requirement between the gas distribution plate 160 and the substrate 150 of <0.6 mm needs to be complied within this embodiment to ensure the plasma is confined and is not formed between the gas distribution plate 160 and the substrate 150.

Figure 1F:
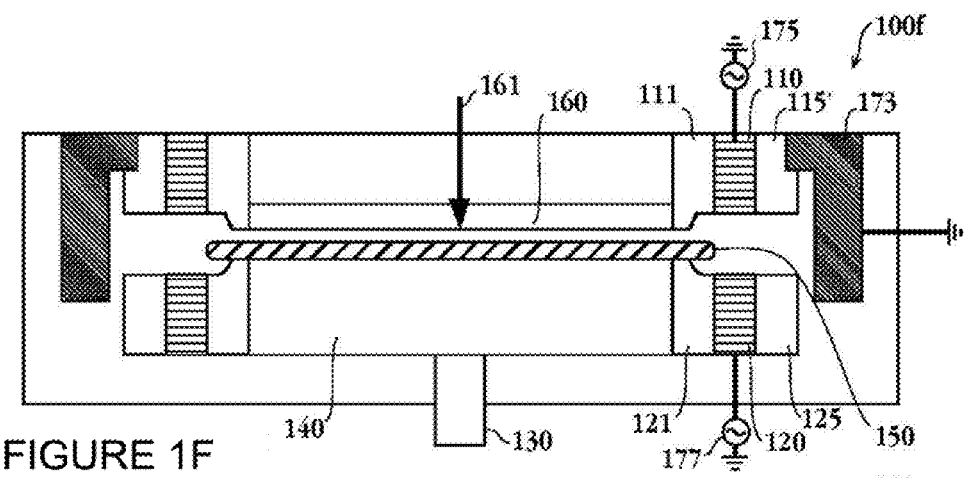
FIG. 1F shows a schematic diagram of another embodiment of a substrate etching system with a pair of top and bottom edge electrodes, and an overhang electrode surrounding the pair of edge electrodes.

In another embodiment (shown in FIG. 1F), the top edge electrode 110 is coupled to a low-frequency RF power supply 175 and the bottom edge electrode 120 is coupled to a high-frequency RF power supply 177. The conductive overhang 171 is grounded. The process conditions and configurations are similar to those discussed in the embodiment of FIG. 1E. Alternatively, the top edge electrode 110 can be coupled to a high-frequency RF, between about 27 MHz to about 60 MHz, power supply 177 and the bottom edge electrode 120 can be coupled to a low-frequency RF, between about 2 MHz to about 13 MHz, power supply.

Figure 1G:
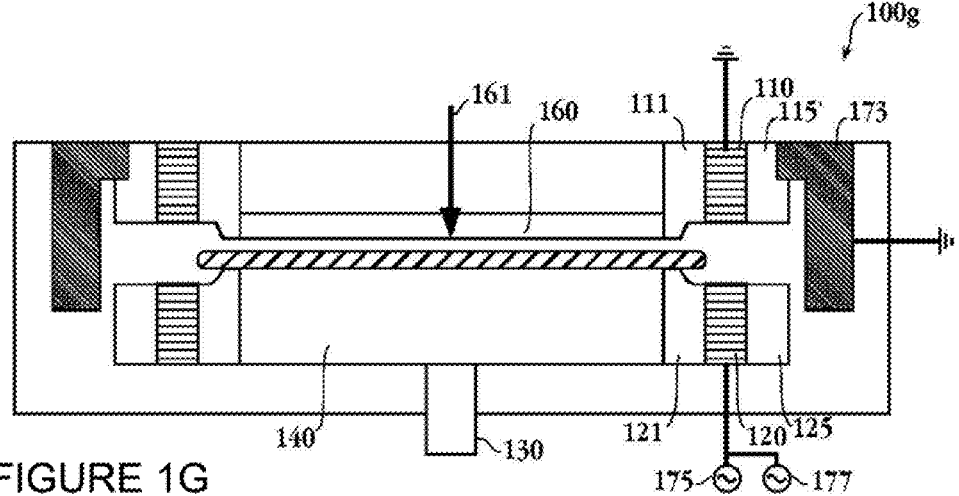
FIG. 1G shows a schematic diagram of yet another embodiment of a substrate etching system with a pair of top and bottom edge electrodes, and an overhang electrode surrounding the pair of edge electrodes.

In yet another embodiment (shown in FIG. 1G), both the top edge electrode 110 and the conductive overhang 171 are grounded. The bottom edge electrode 120 is coupled to two RF power supplies 175, 177 that can supply two types of RF power, one between about 2 MHz and about 13 MHz and the other between about 27 MHz and about 60 MHz. During bevel cleaning, the RF supply that supplies between about 2 MHz to about 13 MHz is turned on. During substrate backside cleaning, the RF power supply that supplies power between about 27 MHz and about 60 MHz is turned on. Alternatively, the top edge electrode 110 can be coupled to two RF power supplies 175 and 177, while the bottom edge electrode 120 and the conductive overhang 171 are grounded.

Figure 1H:
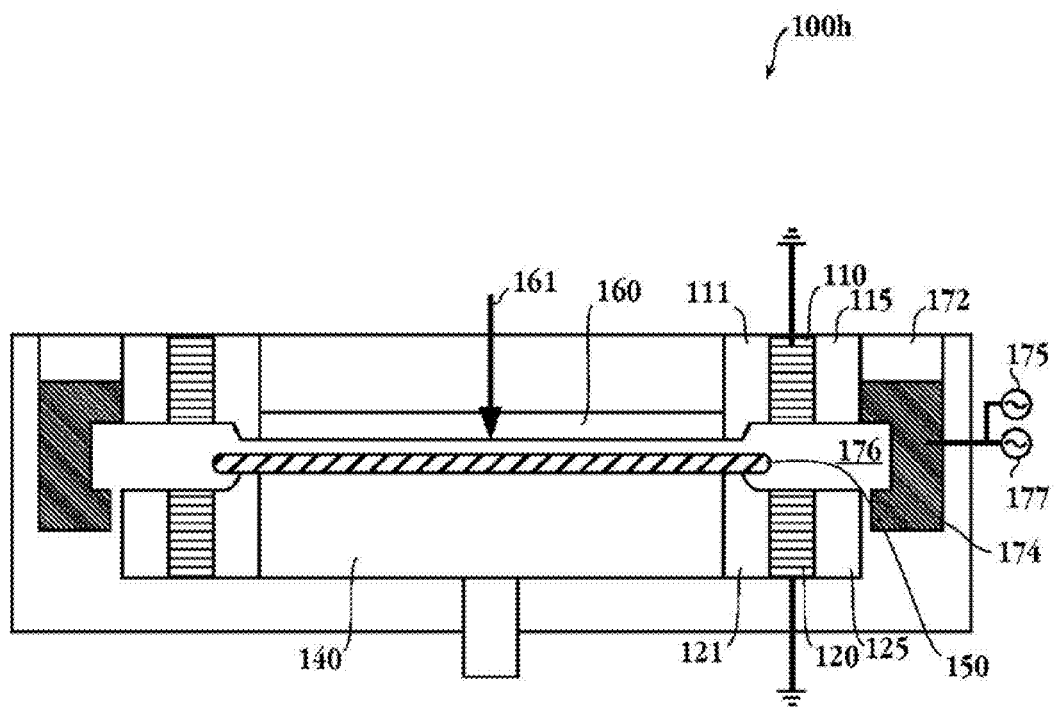
FIG. 1H shows a schematic diagram of an embodiment of a substrate etching system with a pair of top and bottom edge electrodes, and a hollow cathode electrode surrounding the pair of edge electrodes.

In another embodiment as shown in FIG. 1H. Outside the dielectric rings 115 and 125 that surround the top edge electrode 110 and the bottom edge electrode 120 respectively, there is a hollow cathode ring 174, which is made of a conductive material, such as aluminum (Al). The hollow cathode ring 174 has an opening 176 that faces the bevel edge. In one embodiment, the width of the opening 176 is greater than about 1.0 cm. The hollow cathode ring is coupled to an RF power source 175 and both the top edge electrode 110 and the bottom edge electrode 120 are grounded. The gas distribution plate 160 and substrate support 140 are kept floating in this embodiment. In one embodiment, the hollow cathode ring 174 is powered by the RF power supply 175 to generate a plasma processing gas to clean the bevel edge. RF power supply 175 supplies between about 2 MHz to about 13 MHz. In another embodiment, the hollow cathode ring 174 is powered by the RF power supply 177 to generate a plasma processing gas to clean the substrate backside and/or chamber interior. RF power supply 177 supplies power between about 27 MHz and about 60 MHz. In one embodiment, the process gas is supplied through a gas feed 161 near the substrate center. Hollow cathode ring 174 generates a high-density plasma, for example in the range between about 1E10 to about 1E11, that is very efficient in cleaning the bevel edge. For this embodiment, the spacing requirement between the top edge electrode 110 and bottom edge electrode 120, $D_{EE}$, of less than 1.5 cm is no longer needed. However, the requirement between the gas distribution plate 160 and the substrate 150 is still needed to ensure no plasma is formed between the top distribution plate 160 and the substrate 150.

Figure 2A:
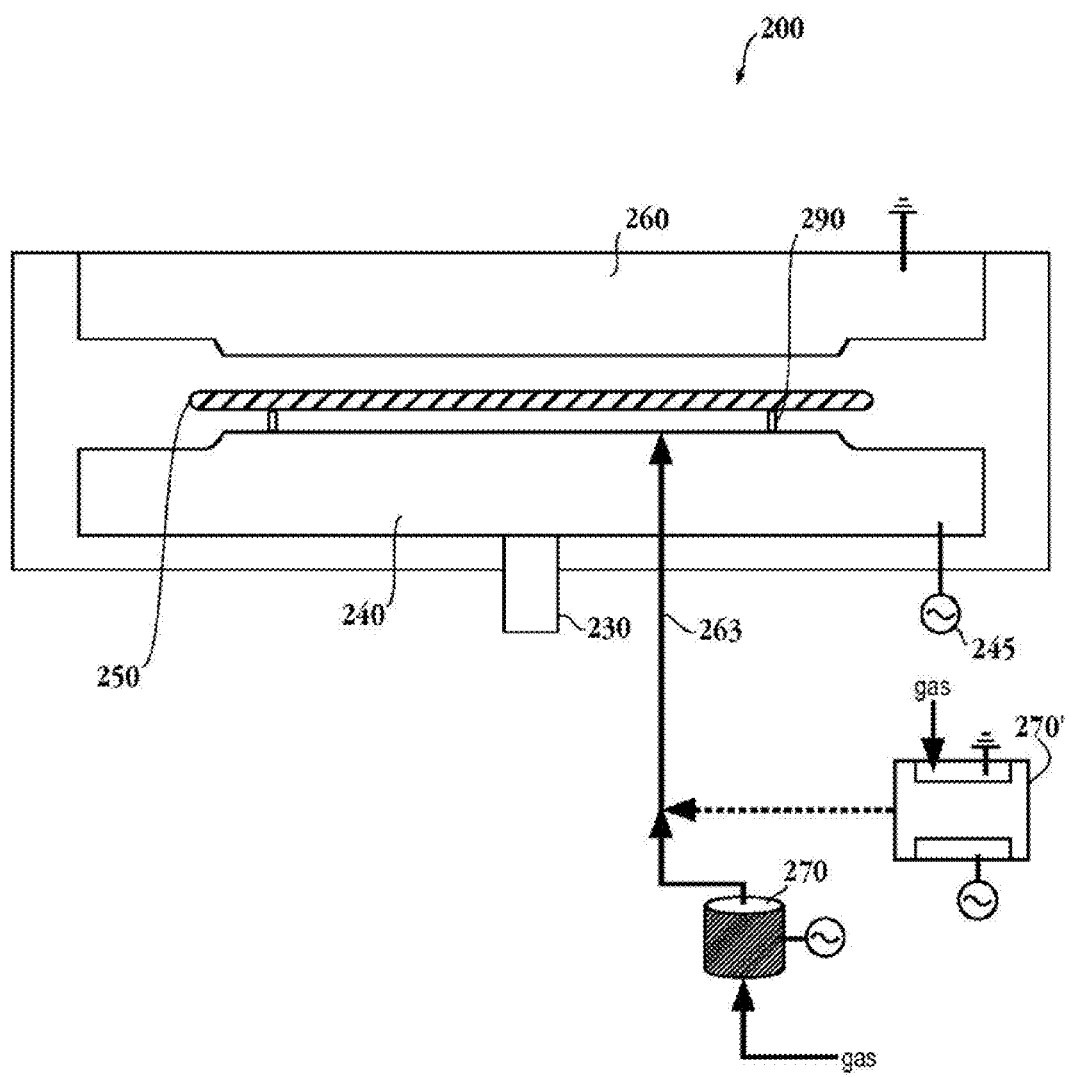
FIG. 2A shows a substrate etching system with a remote plasma cleaning source coupled to the substrate support.

FIG. 2A shows another embodiment of the present invention. In this embodiment, a process chamber 200 has a top gas distribution plate 260 and a substrate support 240. In one embodiment, the gas distribution plate 260 can also be an electrode and the substrate support can be an electrostatic chuck that is coupled to a RF power supply 245. In another embodiment, the substrate support 240 is coupled to a moving assembly 230 that can move the substrate support up and down. During etching of substrate 250, the RF power supply 245 provides RF power to generate a capacitively coupled etch plasma with the grounded top electrode 260 to etch substrate 250. This etch configuration is merely used as an example. Other etch configurations to generate capacitively or inductively plasma to etch substrate 250 can also be used.

A gas feed 263 is embedded in the substrate support 240 to supply a remotely generated cleaning plasma to the backside of the substrate 250 to clean substrate backside or to the chamber 200 to clean the process chamber 200. During substrate backside cleaning, lift pins 290 raise the substrate 250 to separate from the substrate support 240. A remote cleaning plasma source 270 or 270' provides a cleaning plasma to the backside of the substrate 250 to clean the substrate backside. In one embodiment, the remote cleaning plasma is generated by a microwave, which is illustrated as a microwave source 270 in FIG. 2A. In another embodiment, the remote cleaning plasma is generated by a pair of capacitively coupled electrodes as a capacitively coupled plasma (CCP), which is illustrated as a CCP source 270' in FIG. 2A. Other types configurations, such as inductively coupled plasma generator, can also be used to generate remote plasma. As described earlier, during substrate backside, the chamber pressure is kept below 500 mTorr to allow cleaning plasma to diffuse (or spread) under the substrate 250.

The remote plasma supplied through a gas feed 263 embedded in the substrate support 240 can also be used to clean the chamber interior, including chamber walls 201. During cleaning of the chamber interior, substrate 250 can rest on the lift pins 290 or be removed from the substrate chamber 200. During chamber interior cleaning, the chamber pressure is kept below 5 Torr.

Figure 2B:
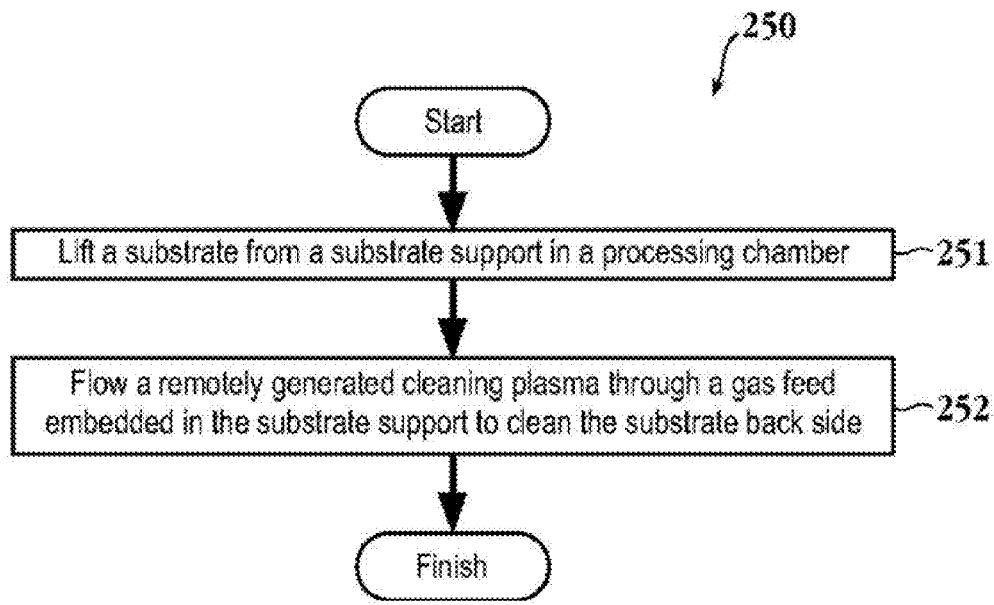
FIG. 2B shows a process flow to clean substrate backside.
Figure 2C:
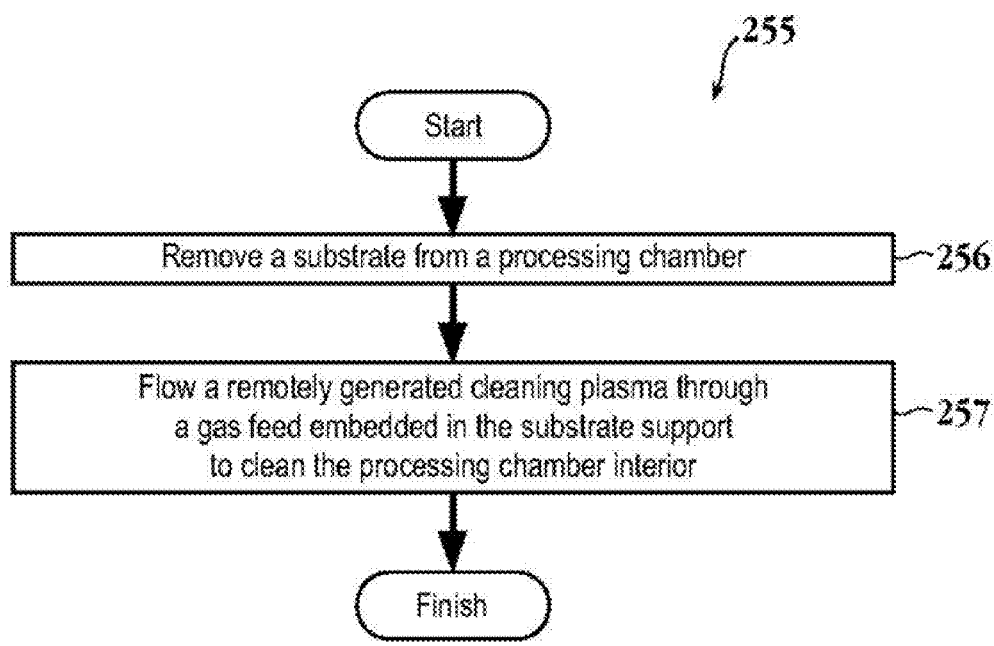
FIG. 2C shows a process flow to clean chamber interior.

FIG. 2B shows an embodiment of a process flow 250 for cleaning the substrate backside. At step 251, a substrate is raised from a substrate support in a processing chamber. At step 252, a remotely generated cleaning plasma is flown through a gas feed embedded in the substrate support to clean the substrate backside. FIG. 2C shows an embodiment of a process flow 255 for cleaning the process chamber. At step 256, a substrate is removed from a substrate processing chamber. The processing chamber can be a deposition chamber, an etch chamber, or other types of chambers that can benefit from such a concept. At step 257, a remotely generated cleaning plasma is flown through a gas feed embedded in the substrate support to clean the processing chamber interior.

Figure 3A:
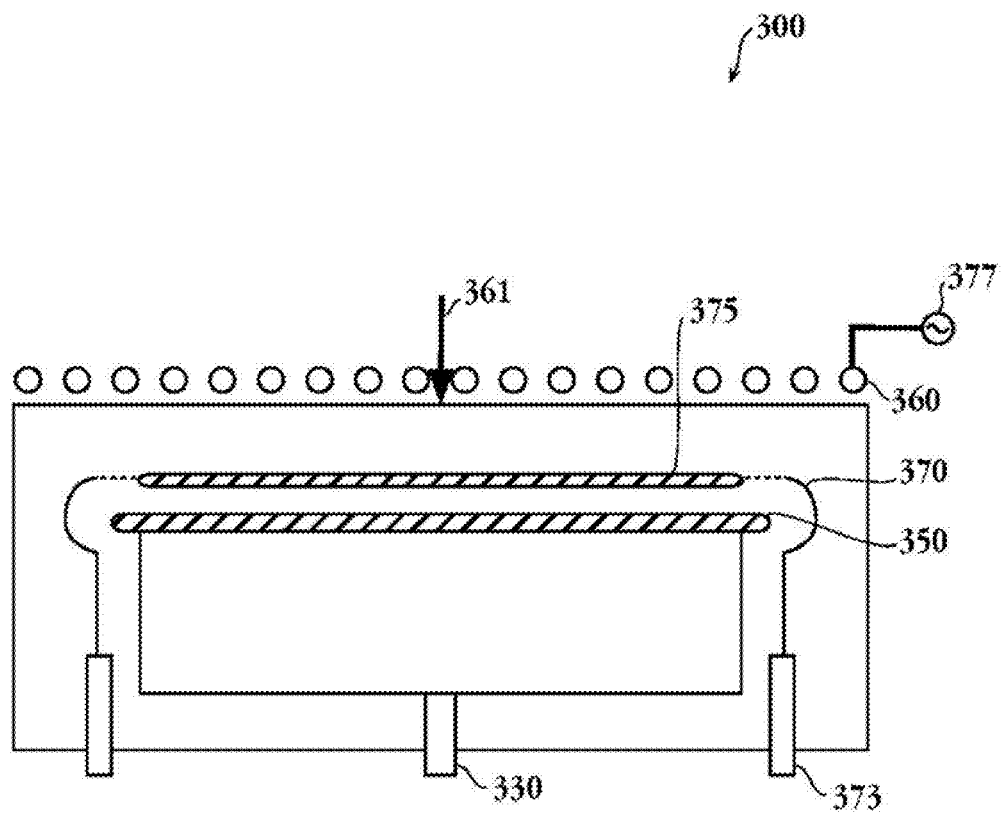
FIG. 3A shows a schematic diagram of an embodiment of a substrate etching system with a substrate cover plate.

FIG. 3A shows an embodiment of a mechanism to clean the substrate bevel edge. In this embodiment, a cover plate 375 is placed over a substrate 350 during bevel cleaning. In one embodiment, the distance between the substrate surface and the surface of the cover plate 370 that faces the substrate 350 is less than about 0.5 mm. The cover plate 370 is made of dielectric materials, such as quartz or ceramic. The cover plate is supported by a support assembly 370, which can be moved up and down by a mechanical mechanism 373. The cover plate support assembly 370 can be made of dielectric materials or has a dielectric coating. Examples of dielectric materials include quartz and ceramic. During substrate etching, cover plate 375 is removed from the substrate surface. The cover plate support 370 is moved to be at the same height as the substrate 350 or below the substrate 350 during etching process. During bevel edge cleaning, a capacitively coupled plasma or inductively coupled plasma can be generated to clean the substrate bevel edge. In the embodiment shown in FIG. 3A, an inductive coil(s) 360 is placed outside chamber 300. The inductive coil(s) 360 is coupled to a RF power source 375. The substrate support 340 is grounded to provide a return path for the inductive plasma. The process gas can be supplied at the top of the process chamber through a gas feed 361, or by other gas feed configurations.

Figure 3B:
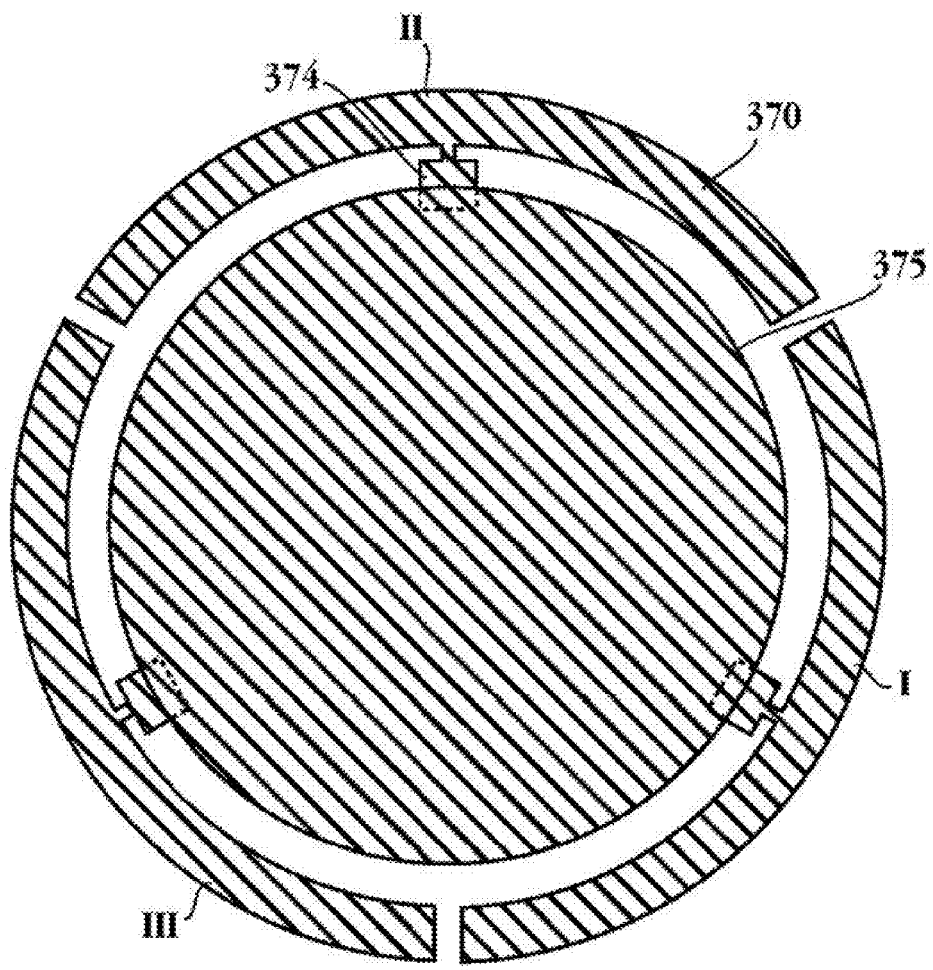
FIG. 3B shows a top schematic diagram of an embodiment of a substrate cover plate with a substrate cover support.

The inductive plasma can clean the substrate bevel edge, while the cover plate protects the main substrate surface. FIG. 3B shows the top view of the cover plate 375 and the cover plate support assembly 370. The cover plate support assembly 370 has multiple support fingers 374 that are used to support the cover plate. In one embodiment, the cover plate support assembly 370 is made of multiple pieces, I, II, and III, that allow the cover plate support 370 to move below the substrate 350 during etching process.

Figure 3C:
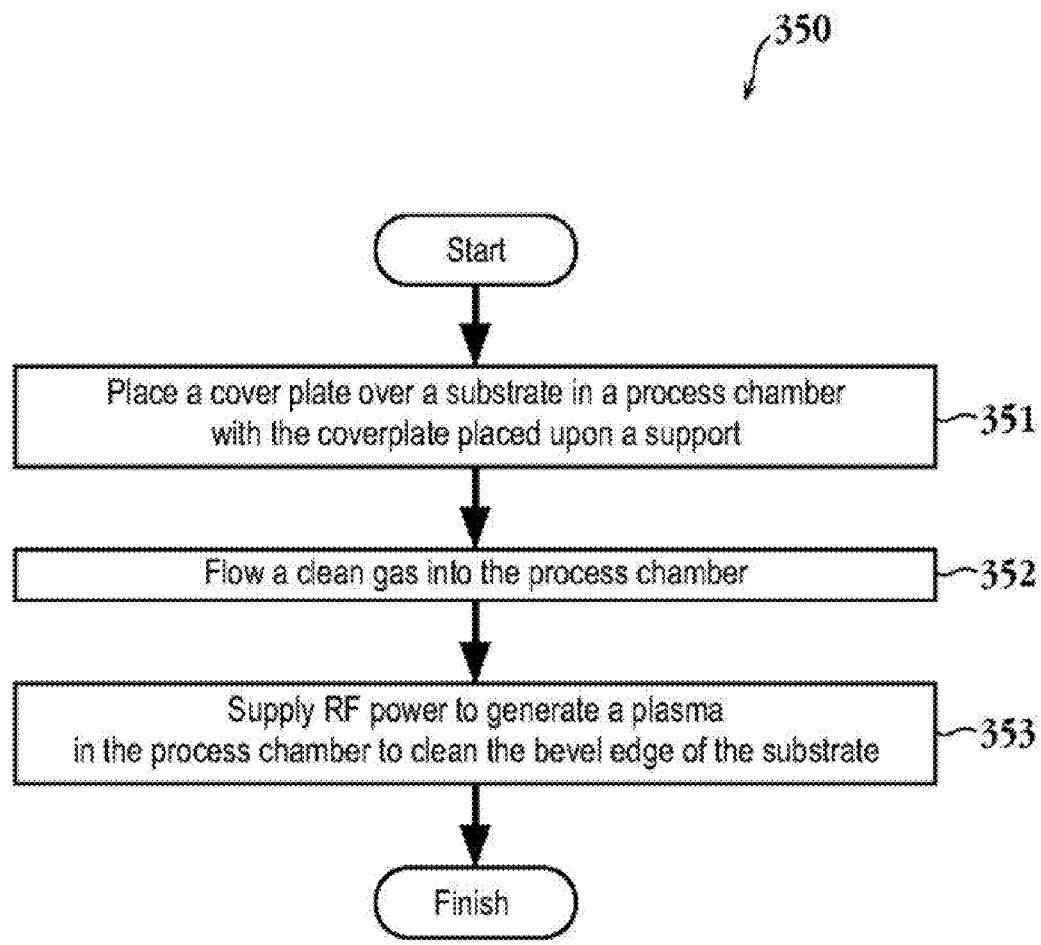
FIG. 3C shows a process flow to clean substrate bevel edge in a substrate etching system with a substrate cover plate.

FIG. 3C shows a bevel edge cleaning process flow 350. The process starts at step 351 by placing a cover plate cover a substrate that sits on a substrate support. The cover plate is placed upon a cover plate support. The cover plate covers the center of the substrate and leaves the substrate bevel edge (or the area between the edge of the cover plate 375 and the edge cover plate support assembly 375) exposed. At step 352, a cleaning gas(es) is flown into the process chamber. At step 353, a RF power is supplied to the electrode to generate a cleaning plasma to clean bevel edge of the substrate.

The embodiments described above provide improved apparatus and methods for cleaning bevel edge, substrate backside and chamber interior. The embodiments and concepts described above to clean bevel edge, substrate backside and chamber interior can be applied to dielectric etch chambers or conductor etch chambers, which include metal etch chamber. The embodiments and concepts described above also can be applied to other types of etch chambers, applicable deposition chambers, and applicable processing chambers.

The improved apparatus and methods for cleaning of bevel edge, substrate backside, and chamber interior reduce undesirable build-up of etch by-products and deposited films on the substrate or chamber interior and enhance the device yields.

Another feature of the invention relates to apparatus and methods for providing an apparatus and methods for the removal of a set of byproducts from a substrate edge. In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into the operational speed and or operability of these devices.

In a first exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. An appropriate set of plasma gases is then flowed into the chamber and struck to form a plasma to etch exposed areas of the substrate.

During an etch process, it is not uncommon for polymer byproducts (composed of Carbon (C), Oxygen (O), Nitrogen (N), Fluorine (F), etc.) to form on the top and bottom of a substrate edge. That is, a surface area on the annular periphery of the substrate where no dies are present. However, as successive polymer layers are deposited as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, byproduct particles may fall on a lower substrate where dies are present, potentially affecting device yield.

Figure 4A:
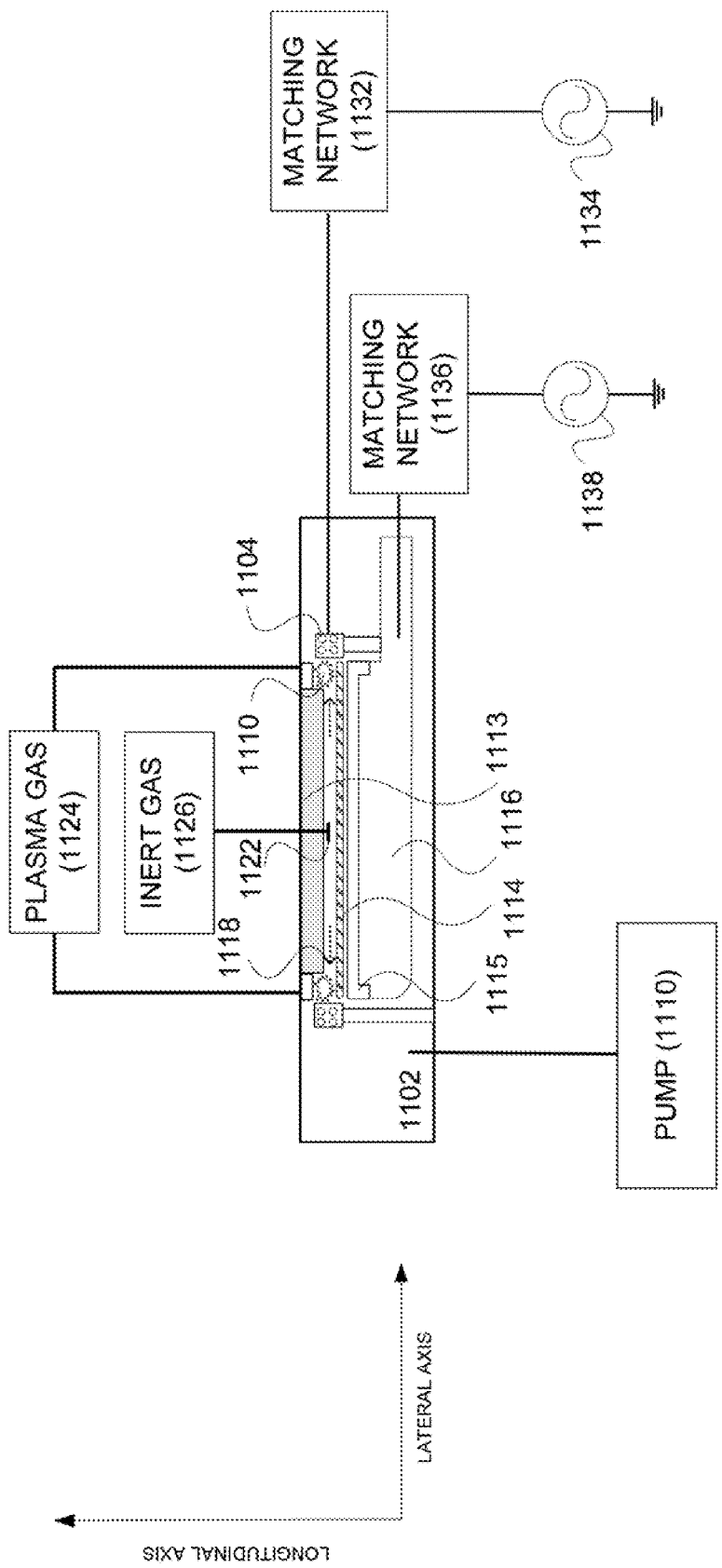
FIG. 4A illustrates a simplified diagram of an inductively coupled plasma processing system with a annular periphery induction coil for edge byproduct removal, according to an embodiment of the invention.

Improvements to address the above-mentioned issues are discussed hereinbelow. Referring now to FIG. 4A, a simplified diagram is shown of an inductively coupled plasma processing system with a annular periphery induction coil (powered electrode) for edge byproduct removal, according to an embodiment of the invention. In an advantageous manner, an inert barrier placed above the substrate, in combination with an inert gas flowing from the substrate center toward the substrate annular periphery, and positioned above the substrate, may substantially isolate the plasma to the substrate edge (edge area), allowing byproducts to be rapidly removed while minimizing potential damage to exposed electrical structures on the substrate surface (center area).

In general, a substrate with a set of edge byproducts is positioned in a plasma chamber with edge ring 1115 on an electrostatic chuck (chuck) 1116. That is, the chuck may be configured to support a first (bottom) surface of the substrate. Annular periphery induction coil 1104 is generally configured to strike plasma 1110 by inducing a time-varying electric current in a set of plasma gases 1124 (e.g., O2, CF4, C2F6, Ar, etc.) optimized for byproduct removal. In an embodiment, annular periphery induction coil 1104 is configured as a ring or doughnut with a diameter (along a lateral axis) at least as large as the diameter of substrate 1114.

Further coupled to annular periphery induction coil 1104, is typically a matching network 1132 that may be further coupled to RF generator 1134. Matching network 1132 attempts to match the impedance of RF generator 1134, which typically operates from about 2 MHz to about 27 MHz, and about 50 ohms, to that of the plasma 1110. Additionally, a second RF energy source 1138 may also be coupled through matching network 1136 to the substrate 1114 in order to create a bias with the plasma, and direct the plasma away from structures within the plasma processing system and toward the substrate.

In addition, in order to substantially isolate plasma 1110 to a surface area at the edge (annular periphery) of the substrate, plasma resistant barrier 1113 (e.g.; quartz, sapphire, etc.) may be placed at a gap distance just above but not touching substrate 1114. That is, substrate 1114 is positioned between plasma resistant barrier 1113 and chuck 1116. In an embodiment, plasma resistant barrier 1113 is configured with a diameter (along a lateral axis) that is smaller than a substrate diameter (along a lateral axis). In an embodiment, plasma resistant barrier 1113 is attached to a top surface of plasma chamber 1102. In addition, a second inert gas 1126 (center inert) flow may also be channeled between plasma resistant barrier 1113 and substrate 1114 with an inert gas delivery arrangement, creating a positive pressure force from the substrate center to the substrate annular periphery of the substrate 1114, and substantially isolating plasma 1110 away from electrical structures on exposed portions of the substrate surface. As byproducts are removed from substrate 1114, they are vented from plasma chamber 1102 by pump 1110.

In an embodiment, the plasma is a low pressure plasma. For example, in an inductively coupled plasma processing system with a power setting of about 100 W to about 500 W, at a pressure of about 5 mTorr to about 1 Ton, and with a plasma gas (O2, CF4, C2F6, AR, etc.) and a inert gas (e.g., He, Ar, N2, etc.), a gap distance of less than about 0.5 mm may be sufficient to isolate plasma 1110 at the substrate annular periphery and thus minimize any potential damage to electrical structures on exposed portions of the substrate surface. In an embodiment, a gap distance is preferably between about 0.1 mm and about 0.5 mm. In an embodiment, a gap distance is more preferably between about 0.2 mm and about 0.4 mm. In an embodiment, a gap distance is most preferably about 0.3 mm.

In an embodiment, the plasma is an atmospheric or high pressure plasma. For example, in an inductively coupled atmospheric plasma processing system with a power setting of about 100 W to about 500 W, at an ambient pressure, and with a plasma gas (O2, CF4, C2F6, He, etc.) and a inert gas (e.g., He, Ar, N2, etc.), a gap distance of less than about 0.1 mm may be sufficient to isolate plasma 1110 at the substrate annular periphery and thus minimize any potential damage to electrical structures on exposed portions of the substrate surface In an embodiment, a gap distance is preferably between about 0.04 mm and about 0.1 mm. In an embodiment, a gap distance is more preferably between about 0.05 mm and about 0.09 mm. In an embodiment, a gap distance is most preferably about 0.07 mm. Advantages of the invention include the removal of a set of byproducts from a substrate edge without substantially damaging electrical structures on exposed portions of the substrate surface.

Figure 4B:
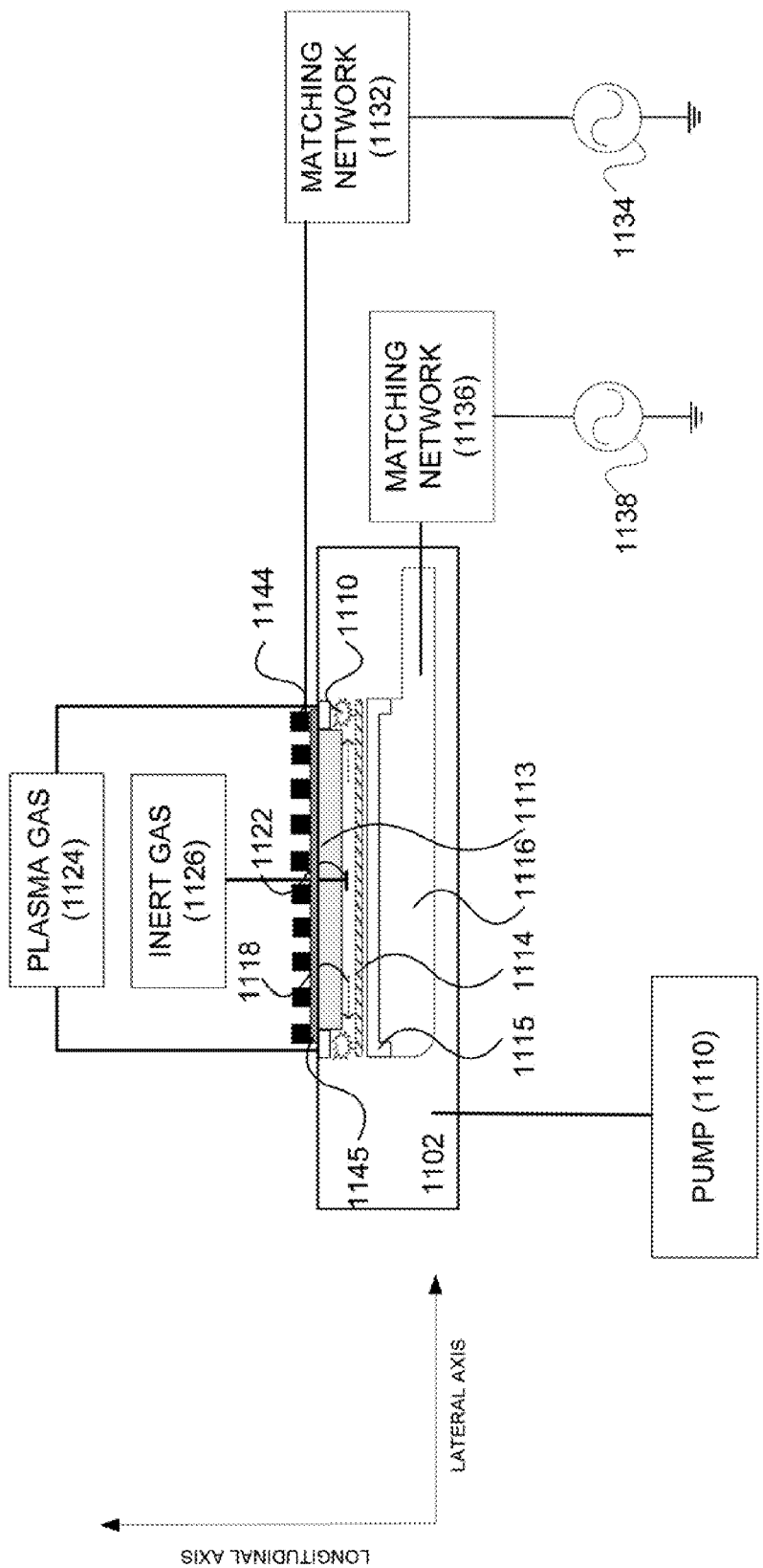
FIG. 4B illustrates a simplified diagram of an inductively coupled plasma processing system with a top induction coil for edge byproduct removal, according to an embodiment of the invention.

Referring now to FIG. 4B, a simplified diagram is shown of an inductively coupled plasma processing system with a top induction coil (powered electrode) for edge byproduct removal according to an embodiment of the invention. In general, a substrate with a set of edge byproducts is positioned in a plasma chamber with edge ring 1115 on an electrostatic chuck (chuck) 1116. That is, the chuck may be configured to support a first (bottom) surface of the substrate. Top induction coil 1144, physically separated from plasma 1110 by an inert plasma resistant barrier 1145 (e.g. ceramic, quartz, etc.), is generally configured to strike plasma 1110 by inducing a time-varying electric current in a set of plasma gases 1124 (e.g., O2, CF4, C2F6, Ar, etc.) optimized for byproduct removal. In an embodiment, top induction coil 1104 is configured as a set of rings. In an embodiment, at least one ring has a diameter (along a lateral axis) at least as large as the diameter of substrate 1114.

Further coupled to top induction coil 1144, is typically a matching network 1132 that may be further coupled to RF generator 1134. Matching network 1132 attempts to match the impedance of RF generator 1134, which typically operates from about 2 MHz to about 27 MHz, and about 50 ohms, to that of the plasma 1110. Additionally, a second RF energy source 1138 may also be coupled through matching network 1136 to the substrate 1114 in order to create a bias with the plasma, and direct the plasma away from structures within the plasma processing system and toward the substrate.

In addition, in order to substantially isolate plasma 1110 to a surface area at the edge (annular periphery) of the substrate, plasma resistant barrier 1113 (e.g., quartz, sapphire, etc.) may be placed at a gap distance just above but not touching substrate 1114. In an embodiment, plasma resistant barrier 1113 is configured with a diameter (along a lateral axis) that is smaller than a substrate diameter (along a lateral axis). That is, substrate 1114 is positioned between plasma resistant barrier 1113 and chuck 1116. In an embodiment, plasma resistant barrier 1113 is attached to a top surface of plasma chamber 1102. In addition, a second inert gas 1126 (inert gas) flow may also be channeled between plasma resistant barrier 1113 and substrate 1114 with an inert gas delivery arrangement, creating a positive pressure force from the substrate center to the substrate annular periphery of the substrate 1114, and substantially isolating plasma 1110 away from electrical structures on exposed portions of the substrate surface. As byproducts are removed from, substrate 1114, they are vented from plasma chamber 1102 by pump 1110.

In an embodiment, the plasma is a low pressure plasma. For example, in an inductively coupled plasma processing system with a power setting of about 100 W to about 500 W, at a pressure of about 5 mTorr to about 1 Torr, and with a plasma gas (O2, CF4, C2F6, AR, etc.) and a inert gas (e.g., He, Ar, N2, etc.), a gap distance of less than about 0.5 mm may be sufficient to isolate plasma 1110 at the substrate annular periphery and thus minimize any potential damage to electrical structures on exposed portions of the substrate surface. In an embodiment, a gap distance is preferably between about 0.1 mm and about 0.5 mm. In an embodiment, a gap distance is more preferably between about 0.2 mm and about 0.4 mm. In an embodiment, a gap distance is most preferably about 0.3 mm.

In an embodiment, the plasma is an atmospheric or high pressure plasma. For example, in an inductively coupled atmospheric plasma processing system with a power setting of about 100 W to about 500 W, at an ambient pressure, and with a plasma gas (O2, CF4, C2F6, He, etc.) and a inert gas (e.g., He, Ar, N2, etc.), a gap distance of less than about 0.1 mm may be sufficient to isolate plasma 1110 at the substrate annular periphery and thus minimize any potential damage to electrical structures on exposed portions of the substrate surface.

In an embodiment, a gap distance is preferably between about 0.04 mm and about 0.1 mm. In an embodiment, a gap distance is more preferably between about 0.05 mm and about 0.09 mm. In an embodiment, a gap distance is most preferably about 0.07 mm. Advantages of the invention include the removal of a set of byproducts from a substrate edge without substantially damaging electrical structures on exposed portions of the substrate surface.

Figure 5:
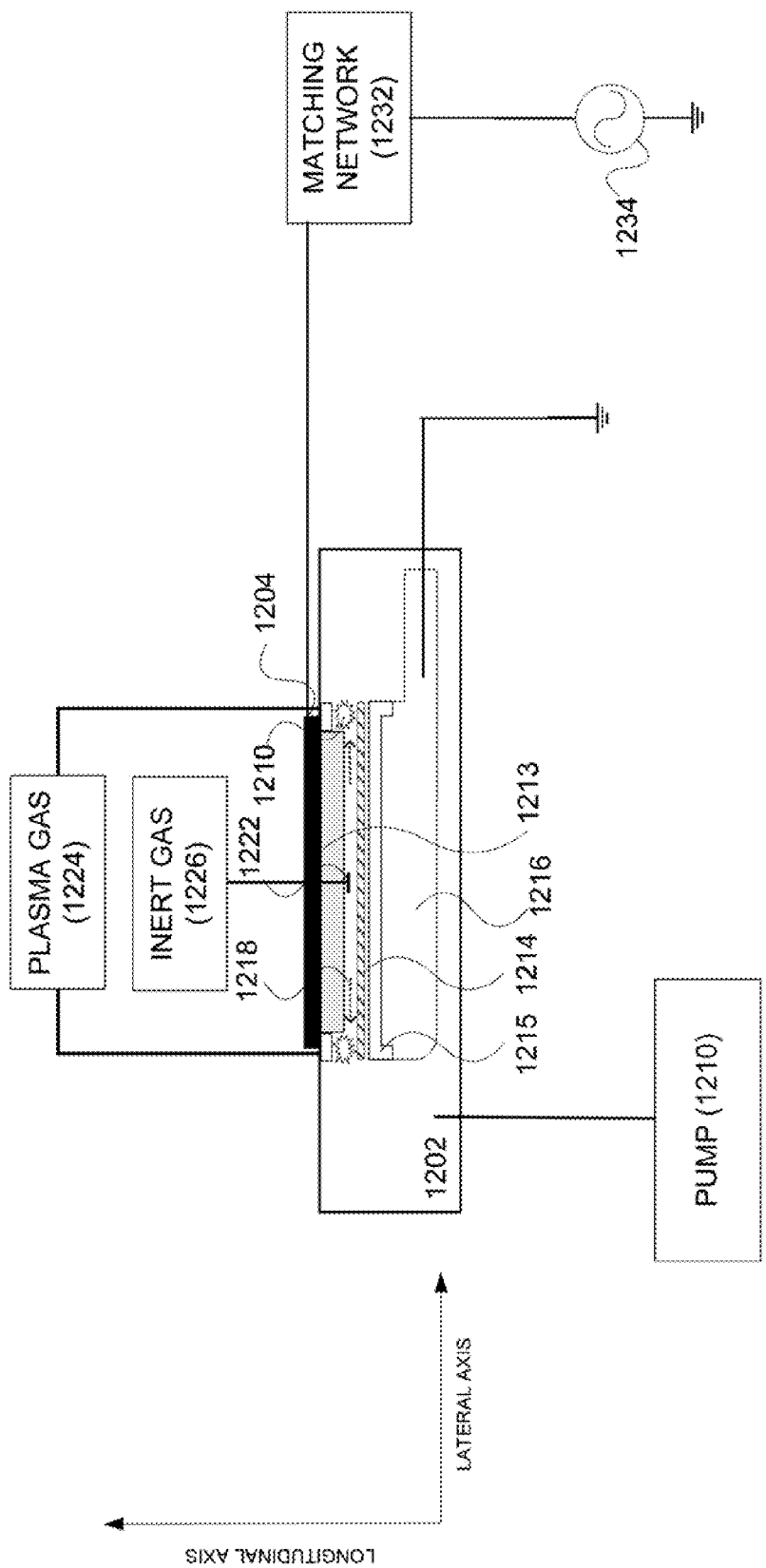
FIG. 5 illustrates a simplified diagram of a capacitively coupled plasma processing system for edge byproduct removal, according to an embodiment of the invention.

Referring now to FIG. 5, a simplified diagram of a capacitively coupled plasma processing system with a powered electrode for edge byproduct removal is shown, according to an embodiment of the invention. In general, a substrate with a set of edge byproducts is positioned in a plasma chamber with edge ring 1215 on a grounded electrostatic chuck (chuck) 1216. That is, the chuck may be configured to support a first (bottom) surface of the substrate. Powered electrode 1204 is generally configured to strike plasma 1210 by inducing a time-varying electric current in a set of plasma gases 1224 (e.g., O2, CF4, C2F6, Ar, etc.) optimized for byproduct removal.

Further coupled to powered electrode 1204, is typically a matching network 1232 that may be further coupled to RF generator 1234. Matching network 1232 attempts to match the impedance of RF generator 1234, which typically operates from about 2 MHz to about 27 MHz, and about 50 ohms, to that of the plasma 1210. In addition, in order to substantially isolate plasma 1210 to a surface area at the edge (annular periphery) of the substrate, inert barrier 1213 (e.g., quartz, sapphire, etc.) may be placed at a gap distance just above but not touching substrate 1214.

In an embodiment, inert barrier 1213 is configured with a diameter (along a lateral axis) that is smaller than a substrate diameter (along a lateral axis). That is, substrate 1214 is positioned between inert barrier 1213 and chuck 1216. In an embodiment, inert barrier 1213 is attached to a top surface of plasma chamber 1202. In addition, a second inert gas 1226 (inert gas) flow may also be channeled between inert barrier 1213 and substrate 1214, creating a positive pressure force from the substrate center to the substrate annular periphery of the substrate 1114, and substantially isolating plasma 1210 away from electrical structures on exposed portions of the substrate surface. As byproducts are removed from substrate 1214, they are vented from plasma chamber 1202 by pump 1210.

In an embodiment, the plasma is a low pressure plasma. For example, in an inductively coupled plasma processing system with a power setting of about 100 W to about 500 W, at a pressure of about 5 mTorr to about 1 Torr, and with a plasma gas (O2, CF4, C2F6, AR, etc.) and a inert gas (e.g., He, Ar, N2, etc.), a gap distance of less than about 0.5 mm may be sufficient to isolate plasma 1310 at the substrate annular periphery and thus minimize any potential damage to electrical structures on exposed portions of the substrate surface. In an embodiment, a gap distance is preferably between about 0.1 mm and about 0.5 mm. In an embodiment, a gap distance is more preferably between about 0.2 mm and about 0.4 mm. In an embodiment, a gap distance is most preferably about 0.3 mm.

In an embodiment, the plasma is an atmospheric or high pressure plasma. For example, in an inductively coupled atmospheric plasma processing system with a power setting of about 100 W to about 500 W, at an ambient pressure, and with a plasma gas (O2, CF4, C2F6, He, etc.) and a inert gas (e.g., He, Ar, N2, etc.), a gap distance of less than about 0.1 mm may be sufficient to isolate plasma 1110 at the substrate annular periphery and thus minimize any potential damage to electrical structures on exposed portions of the substrate surface In an embodiment, a gap distance is preferably between about 0.04 mm and about 0.1 mm. In an embodiment, a gap distance is more preferably between about 0.05 mm and about 0.09 mm. In an embodiment, a gap distance is most preferably about 0.07 mm. Advantages of the invention include the removal of a set of byproducts from a substrate edge without substantially damaging electrical structures on exposed portions of the substrate surface.

Figure 6:
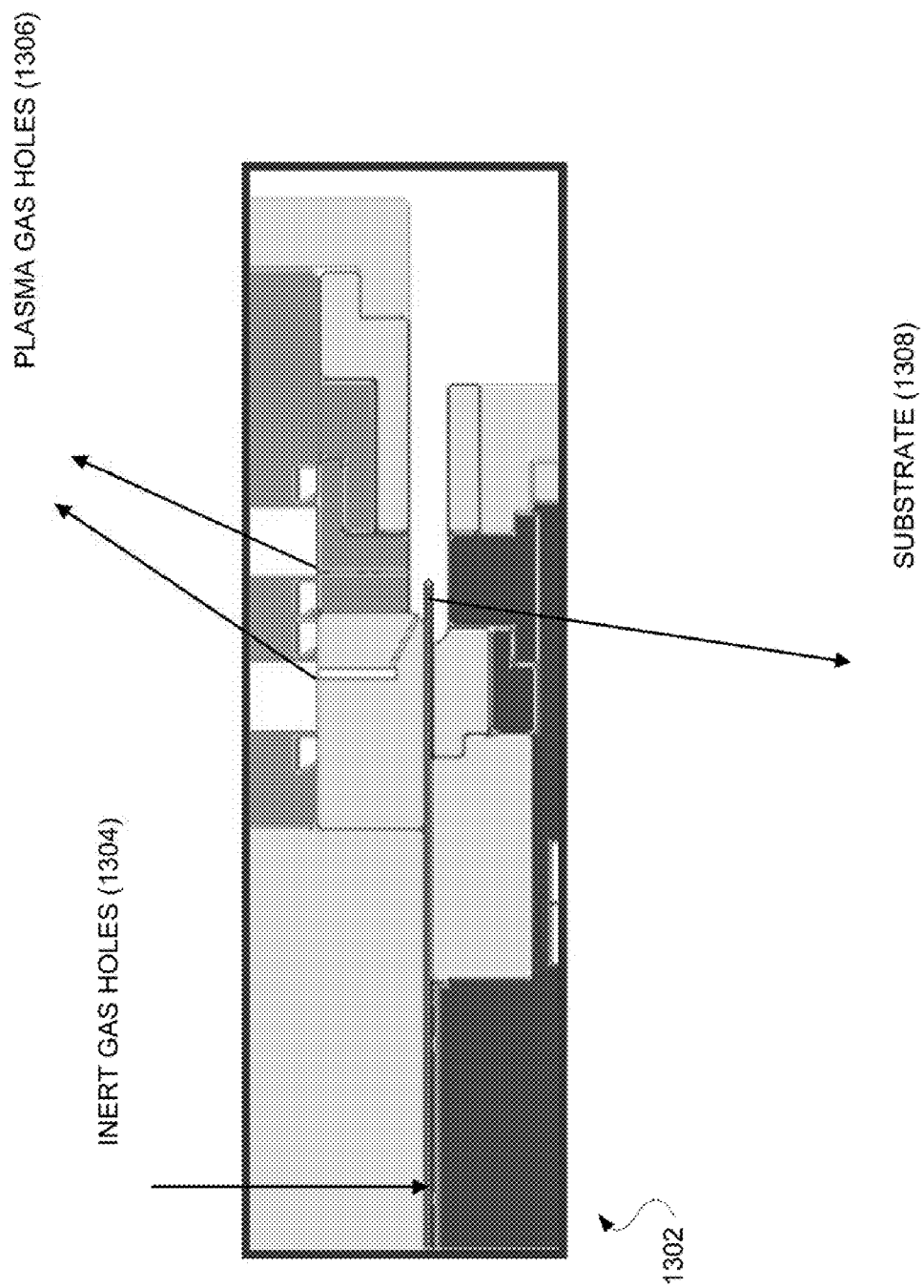
FIG. 6 illustrates a simplified diagram showing the gas configuration for the plasma processing systems, as shown in FIGS. 4A-5, according to an embodiment of the invention.

Referring now to FIG. 6, a simplified diagram is shown of the gas configuration for the plasma processing systems, as shown in FIGS. 4A-5, according to an embodiment of the invention. As previously described, a set of plasma gases (e.g., O2, CF4, C2F6, Ar, etc.) may be flowed into plasma chamber 1302 through a set of plasma gas holes 1306, in order to strike a plasma (not shown) in order to remove a set of edge byproducts from substrate 1308. In addition, in order to substantially isolate the plasma (not shown) to a surface area at the edge (annular periphery) of substrate 1308, a second inert gas (inert gas) flow may also be channeled through a set of inert gas holes 1304, creating a positive pressure force from the substrate center to the substrate annular periphery of the substrate 1308, and substantially isolating the plasma not shown) away from electrical structures on exposed portions of the substrate surface. In an embodiment, the set of plasma gas holes 1306 is positioned near the edge (annular periphery) of substrate 1308. In an embodiment, the set of plasma gas holes 1306 is positioned of the edge (annular periphery) of substrate 1308.

Figure 7:
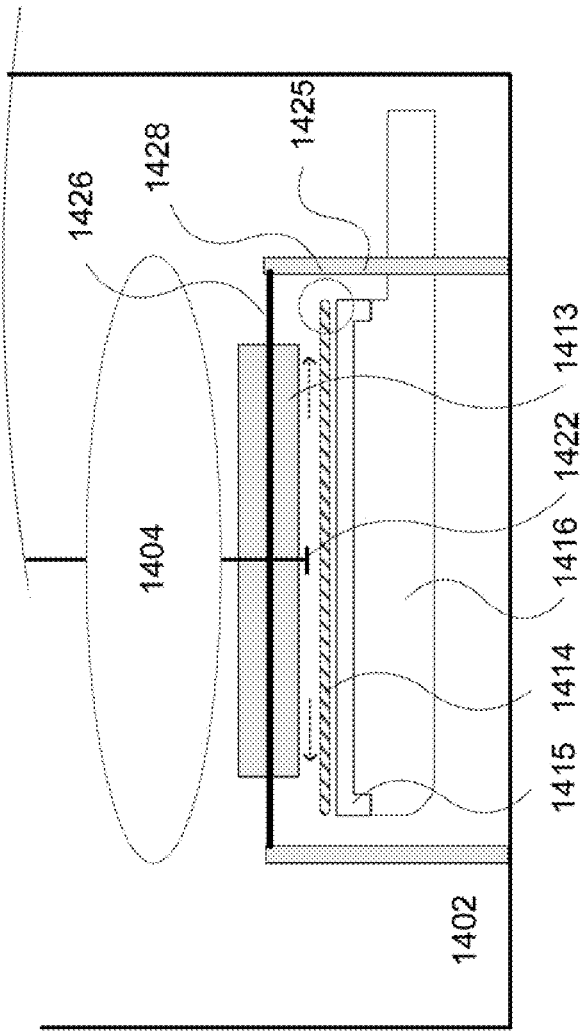
FIG. 7 illustrates a simplified diagram of a plasma processing system for edge byproduct removal, in which an inert barrier is supported with a bottom attachment support structure, according to an embodiment of the invention.
Figure 7:

Referring now to FIG. 7, a simplified diagram of a plasma processing system (capacitively coupled, inductively coupled, atmospheric, etc.) for edge byproduct removal, in which an inert barrier is supported with a bottom attachment support structure, according to an embodiment of the invention. In advantageous manner, a bottom attachment support structure may allow edge byproduct removal functionality to be more easily retrofitted into existing plasma processing systems since existing plasma chamber electrodes (e.g., induction coil, powered electrode, grounded electrode, etc.) may not need to be repositioned in order to secure inert barrier 1403. The bottom attachment support structure may generally comprise a set of longitudinal support members 1425 and a set of lateral support members 1426 that may correctly position inert barrier 1413 at an appropriate gap distance above substrate 1414, such that only substrate edge 1420 may be substantially exposed to plasma 1424.

In general, plasma 1404 is created by flowing a set of plasma gases [not shown] (e.g., O2, CF4, C2F6, Ar, etc.) into plasma chamber 1402, at which point plasma 1404 is struck in order to remove a set of edge byproducts from substrate 1414, positioned with edge ring 1415 on a chuck 1416. In an embodiment, lateral support members and longitudinal support members comprise an inert material (e.g., quartz, sapphire, etc.). In an embodiment, the set of longitudinal support members 1425 and the set of lateral support members 1426 comprise a single manufactured unit. In an embodiment, lateral support members 1426 are configured to allow substrate edge 1428 to be exposed to a substantial portion of plasma 1404. In an embodiment, the set of longitudinal support members 1425 is attached to chuck 1416.

In addition, a second inert gas flow (not shown) may also be channeled between inert barrier 1413 and substrate 1414, creating a positive pressure force from the substrate center to the substrate annular periphery of the substrate 1414, and substantially isolating plasma 1404 away from electrical structures on exposed portions of the substrate surface.

Figure 8:
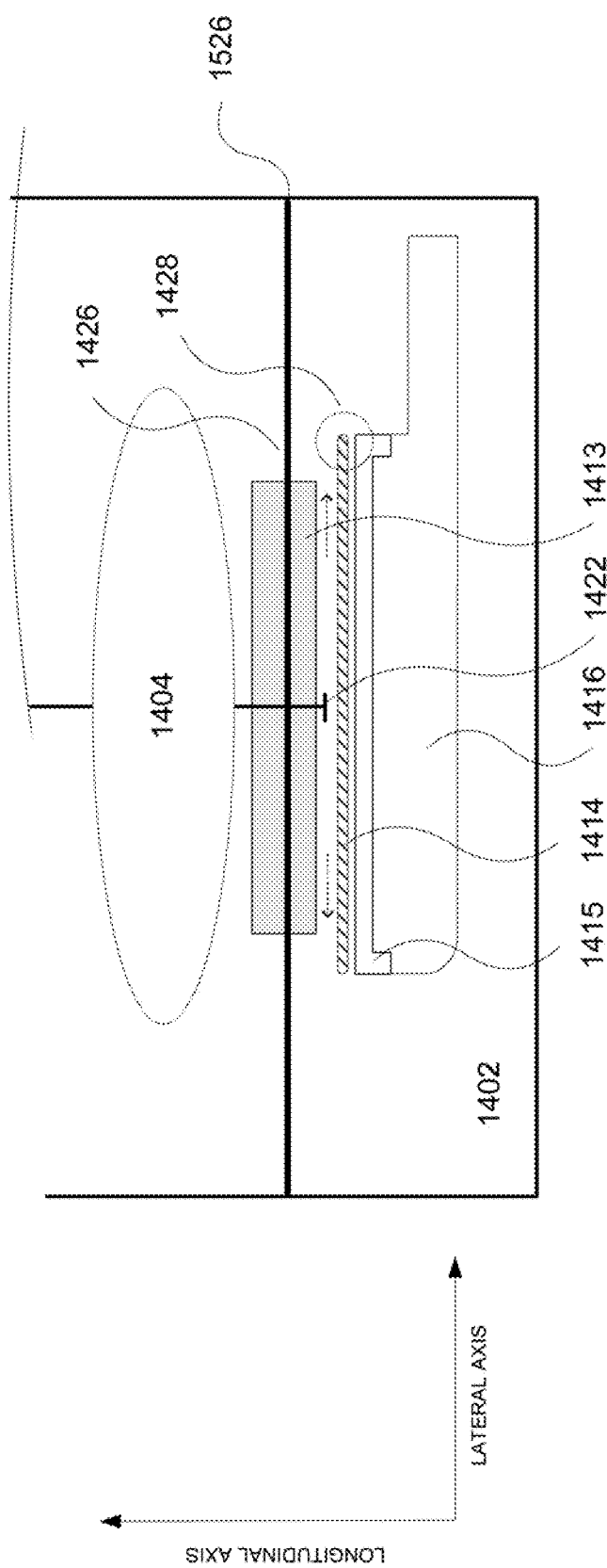
FIG. 8 illustrates a simplified diagram of a plasma processing system for edge byproduct removal, in which an inert barrier is supported with a lateral attachment support structure, according to an embodiment of the invention.

Referring now to FIG. 8, a simplified diagram of a plasma processing system (capacitively coupled, inductively coupled, atmospheric, etc.) for edge byproduct removal, in which an inert barrier is supported with a lateral attachment support structure, according to an embodiment of the invention. In advantageous manner, a lateral attachment support structure may allow edge byproduct removal functionality to be more easily retrofitted into existing plasma processing systems since existing plasma chamber electrodes (e.g., induction coil, powered electrode, grounded electrode, etc.) may not need to be repositioned in order to secure inert barrier 1413. The lateral attachment support structure may generally comprise a set of lateral support members 1526 that may correctly position inert barrier 1413 at an appropriate gap distance above substrate 1414, such that only substrate edge 1420 may be exposed to plasma 1424.

In general, plasma 1404 is created by flowing a set of plasma gases (not shown) (e.g., O2, CF4, C2F6, Ar, etc.) into plasma chamber 1402, at which point plasma 1404 is struck in order to remove a set of edge byproducts from substrate 1414, positioned with edge ring 1415 on a chuck 1416. In an embodiment, lateral support members comprise an inert material (e.g., quartz, sapphire, etc.). In an embodiment, lateral support members 1426 are configured to allow substrate edge 1428 to be exposed to a substantial portion of plasma 1404. In an embodiment, the set of lateral support members 1425 is attached to the plasma chamber walls. In addition, a second inert gas flow [not shown] may also be channeled between inert barrier 1413 and substrate 1414, creating a positive pressure force from the substrate center to the substrate annular periphery of the substrate 1414, and substantially isolating plasma 1404 away from electrical structures on exposed portions of the substrate surface.

Figure 9:
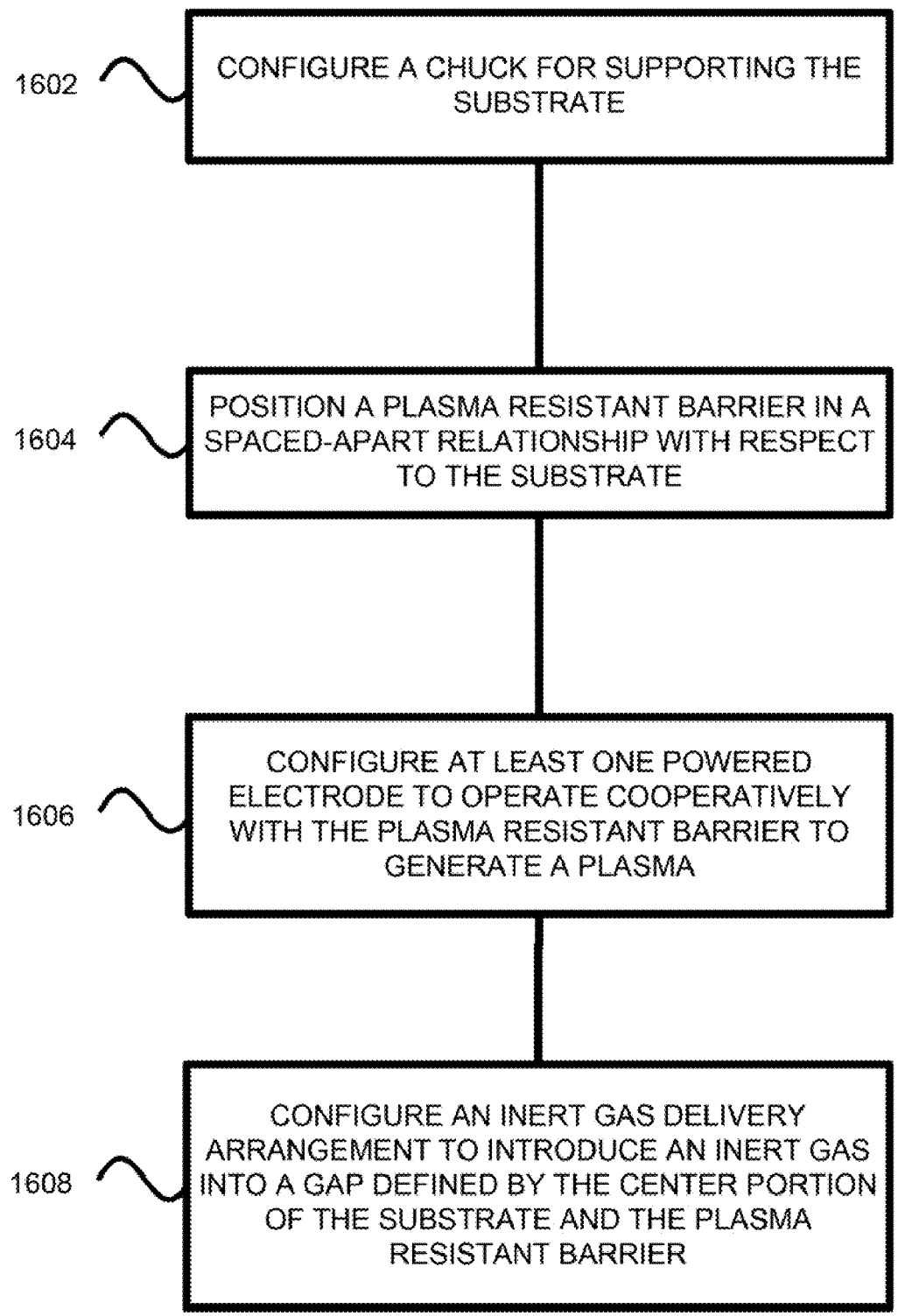
FIG. 9 illustrates a simplified method for the removal of a set of byproducts from a substrate edge, according to an embodiment of the invention.

Referring not to FIG. 9, a simplified method for the removal of a set of byproducts from a substrate edge is shown, according to an embodiment of the invention.

Initially, at 1602, a chuck is configured for supporting the substrate. Next, at 1604, a plasma resistant barrier is positioned in a spaced-apart relationship with respect to the substrate. Next, at 1606, at least one powered electrode is configured to operate cooperatively with the plasma resistant barrier to generate a plasma from a set of plasma gases. In an embodiment, the set of plasma gases includes at least one of O2, CF4, C2F6, and Ar. Finally, at 1608, an inert gas delivery arrangement is configured to introduce an inert gas into a gap defined by the center portion of the substrate and the plasma resistant barrier. In an embodiment, the inert gas includes at least one of He, Ar, and N2.

Advantages of the invention include the rapid and safe removal of edge byproducts from a substrate surface. Additional advantages include the ability to easily retrofit the invention into existing plasma processing systems.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCD, etc.). Furthermore, the term set as used herein includes one or more of the named element of the set. For example, a set of "X" refers to one or more "X."

It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method of cleaning a bevel edge of a substrate in a processing chamber, comprising:
    placing a substrate on a substrate support in said processing chamber;
    flowing a cleaning gas through a gas feed located near a center of a gas distribution plate opposing said substrate support, and disposed at a distance from said substrate support; and
    generating a cleaning plasma near said bevel edge of said substrate to clean said bevel edge by powering an edge electrode, said edge electrode being one of a bottom edge electrode and a top edge electrode, with a RF power source and grounding said edge electrode that is not powered by said RF power source, said bottom edge electrode surrounds said substrate support and said top edge electrode surrounds said gas distribution plate, wherein said bottom edge electrode has at least a portion of a top surface at the same level as a top surface of said substrate support, wherein there is provided a bottom dielectric ring being disposed between said bottom edge electrode and said substrate support, wherein said bottom dielectric ring is in surrounding relationship with said substrate support, said bottom dielectric ring electrically separating said substrate support and said bottom edge electrode; further wherein said gas distribution plate is provided with at least a gas feed for supplying a gas; further wherein there is provided a top dielectric ring surrounding said gas distribution plate, wherein said top edge electrode surrounds said gas distribution plate opposing said substrate support, wherein said top dielectric ring is disposed between said top edge electrode and said gas distribution plate, and said top edge electrode and said gas distribution plate are electrically isolated from each other by said top dielectric ring; and wherein there is further provided a bottom insulating ring surrounding and coupled to said bottom edge electrode, wherein said bottom edge electrode is disposed between said bottom insulating ring and said bottom dielectric ring, and wherein an inner portion of said bottom insulating ring is taller than an outer portion of said bottom insulating ring, said inner portion of said bottom insulating ring being disposed closer to said bottom edge electrode than said outer portion of said bottom insulating ring.

2. The method of claim 1 further including placing a cover plate over at least a portion of said substrate during said cleaning.

3. The method of claim 2 wherein said cover plate covers a center of said substrate and leaves said bevel edge of said substrate exposed during said cleaning.

4. The method of claim 1 wherein said RF power source provides an RF power at a frequency between 2 MHz and 13 MHz to generate said cleaning plasma.

5. The method of claim 1 wherein said cleaning gas including at least one of a oxygen-containing gas, a fluorine-containing gas, a nitrogen-containing gas, an inert gas, and a chlorine-containing gas.

6. The method of claim 1 wherein a distance of less than 1.5 cm exists between said top edge electrode and said bottom edge electrode to confine said cleaning plasma.

7. The method of claim 1 wherein a distance between said gas distribution plate and said substrate is less than 0.6 mm to prevent a plasma from being formed between said top edge electrode and said substrate during said cleaning.

8. A method of cleaning a bevel edge of a substrate in a plasma processing chamber, comprising:
    providing an RF power source;
    providing a substrate support configured for supporting a first surface of said substrate;
    providing a bottom edge electrode surrounding said substrate support;
    providing a bottom dielectric ring disposed between said bottom edge electrode and said substrate support, said bottom dielectric ring surrounding said substrate support, said bottom dielectric ring electrically separating said substrate support and said bottom edge electrode;
    providing a gas distribution plate opposing said substrate support, said gas distribution plate including at least a gas feed for supplying a gas;
    providing a top dielectric ring surrounding said gas distribution plate;
    providing a top edge electrode surrounding said gas distribution plate opposing said substrate support, wherein said top dielectric ring is disposed between said top edge electrode and said gas distribution plate, and said top edge electrode and said gas distribution plate are electrically isolated from each other by said top dielectric ring; and
    providing a bottom insulating ring surrounding and coupled to said bottom edge electrode, wherein said bottom edge electrode is disposed between said bottom insulating ring and said bottom dielectric ring, an'd wherein an inner portion of said bottom insulating ring is taller than an outer portion of said bottom insulating ring, said inner portion of said bottom insulating ring being disposed closer to said bottom edge electrode than said outer portion of said bottom insulating ring, wherein a cleaning gas is fed through said gas feed and a cleaning plasma is generated near said bevel edge of said substrate and said cleaning plasma is utilized for cleaning said bevel edge of said substrate.

9. The method of claim 8 further including providing a top insulating ring surrounding and coupled to said top edge electrode, wherein a bottom surface of said top insulating ring is disposed higher than a bottom surface of said top edge electrode, for diffusing said cleaning plasma, and wherein an inner portion of said top insulating ring is disposed closer to said top edge electrode than said outer portion of said top insulating ring.

10. The method of claim 9 further includes providing a moving assembly coupled to said substrate support, wherein said moving assembly is configured for moving said substrate support in a vertical direction.

11. The method of claim 9 wherein said RF power source provides an RF power at a frequency between 2 MHz and 13 MHz to generate said cleaning plasma.

12. The method of claim 9 wherein said cleaning gas including at least one of an oxygen-containing gas, a fluorine-containing gas, a nitrogen-containing gas, an inert gas, and a chlorine-containing gas.

13. The method of claim 9 wherein a distance of less than 1.5 cm exists between said top edge electrode and said bottom edge electrode to confine said cleaning plasma.

14. The method of claim 9 wherein a distance between said gas distribution plate and said substrate is less than 0.6 mm to prevent a plasma from being formed between said top edge electrode and said substrate during said cleaning.

15. The method of claim 9 wherein pressure within said plasma processing chamber is between 100 mTorr and 2 Torr.

* * * * *